(12) United States Patent
Sills et al.

(10) Patent No.: US 8,652,909 B2
(45) Date of Patent: Feb. 18, 2014

(54) METHODS OF FORMING A NONVOLATILE MEMORY CELL AND METHODS OF FORMING AN ARRAY OF NONVOLATILE MEMORY CELLS ARRAY OF NONVOLATILE MEMORY CELLS

(75) Inventors: Scott E. Sills, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/532,483

(22) Filed: Jun. 25, 2012

(65) Prior Publication Data
US 2012/0264272 A1    Oct. 18, 2012

Related U.S. Application Data

(62) Division of application No. 12/979,189, filed on Dec. 27, 2010, now Pat. No. 8,431,458.

(51) Int. Cl.
*H01L 21/8236* (2006.01)
*H01L 21/3205* (2006.01)

(52) U.S. Cl.
USPC ........... 438/277; 438/587; 438/592; 438/652; 257/202; 257/618

(58) Field of Classification Search
USPC ........ 438/3, 95, 277, 587, 592, 652; 257/202, 257/618, E21.233, E21.258, E21.522
See application file for complete search history.

(56) References Cited

U.S. PATENT DOCUMENTS

| | | | |
|---|---|---|---|
| 4,715,685 A | 12/1987 | Yaniv et al. |
| 4,964,080 A | 10/1990 | Tzeng |
| 5,049,970 A | 9/1991 | Tanaka et al. |
| 5,122,476 A | 6/1992 | Fazan et al. |
| 6,524,867 B2 | 2/2003 | Yang et al. |
| 6,552,952 B2 | 4/2003 | Pascucci |
| 6,687,147 B2 | 2/2004 | Frickie et al. |
| 6,693,821 B2 | 2/2004 | Hsu et al. |
| 6,693,846 B2 | 2/2004 | Fibranz |
| 6,717,881 B2 | 4/2004 | Oishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |

(Continued)

FOREIGN PATENT DOCUMENTS

| | | |
|---|---|---|
| CN | 1444284 | 9/2003 |
| CN | 1459792 | 12/2003 |

(Continued)

OTHER PUBLICATIONS

"Programmable metallization cell", Dec. 11, 2007. Downloaded from http://en.wikipedia.org/wiki/Programmable_metallization_cell on Dec. 13, 2011.

(Continued)

*Primary Examiner* — Hsien Ming Lee
(74) *Attorney, Agent, or Firm* — Wells St. John, P.S.

(57) ABSTRACT

A method of forming a nonvolatile memory cell includes forming a first electrode and a second electrode of the memory cell. Sacrificial material is provided between the first second electrodes. The sacrificial material is exchanged with programmable material. The sacrificial material may additionally be exchanged with select device material.

12 Claims, 22 Drawing Sheets

(56) References Cited

U.S. PATENT DOCUMENTS

| | | |
|---|---|---|
| 6,806,531 B1 | 10/2004 | Chen et al. |
| 6,834,008 B2 | 12/2004 | Rinerson et al. |
| 6,873,544 B2 | 3/2005 | Perner |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schoelesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,465,675 B2 | 12/2008 | Koh |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,666,526 B2 | 2/2010 | Chen et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,696,077 B2 | 4/2010 | Liu |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,838,861 B2 | 11/2010 | Klostermann |
| 7,842,991 B2 | 11/2010 | Cho et al. |
| 7,907,436 B2 | 3/2011 | Maejima et al. |
| 7,910,909 B2 | 3/2011 | Kim et al. |
| 7,948,784 B2 | 5/2011 | Kajigaya |
| 8,021,897 B2 | 9/2011 | Sills et al. |
| 8,043,926 B2 | 10/2011 | Cho et al. |
| 8,048,755 B2 | 11/2011 | Sandhu et al. |
| 8,094,477 B2 | 1/2012 | Maejima |
| 8,106,375 B2 | 1/2012 | Chen et al. |
| 8,154,908 B2 | 4/2012 | Maejima et al. |
| 2002/0018355 A1 | 2/2002 | Johnson et al. |
| 2002/0196695 A1 | 12/2002 | Pascucci |
| 2003/0174042 A1 | 9/2003 | Aono et al. |
| 2003/0174570 A1 | 9/2003 | Ooishi |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0245547 A1 | 12/2004 | Stipe |
| 2005/0001257 A1 | 1/2005 | Schloesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0205943 A1 | 9/2005 | Yamada |
| 2005/0250281 A1 | 11/2005 | Ufert et al. |
| 2005/0269646 A1 | 12/2005 | Yamada |
| 2005/0287741 A1 | 12/2005 | Ding |
| 2006/0035451 A1 | 2/2006 | Hsu |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |
| 2006/0258079 A1 | 11/2006 | Lung et al. |
| 2006/0274593 A1 | 12/2006 | Kurotsuchi et al. |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0045615 A1 | 3/2007 | Cho et al. |
| 2007/0048990 A1 | 3/2007 | Zhuang et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0099753 A1 | 5/2008 | Song et al. |
| 2008/0102278 A1 | 5/2008 | Kreupl et al. |
| 2008/0106925 A1 | 5/2008 | Paz De Araujo et al. |
| 2008/0157257 A1 | 7/2008 | Bertin et al. |
| 2008/0175031 A1 | 7/2008 | Park et al. |
| 2008/0185571 A1 | 8/2008 | Happ et al. |
| 2008/0212361 A1 | 9/2008 | Bertin et al. |

(56) References Cited

U.S. PATENT DOCUMENTS

| | | |
|---|---|---|
| 2008/0232160 A1 | 9/2008 | Gopalakrishnan |
| 2008/0247219 A1 | 10/2008 | Choi et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0085121 A1 | 4/2009 | Park et al. |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0250681 A1 | 10/2009 | Smythe et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0317540 A1 | 12/2009 | Sandhu et al. |
| 2010/0003782 A1 | 1/2010 | Sinha et al. |
| 2010/0008163 A1 | 1/2010 | Liu |
| 2010/0044666 A1 | 2/2010 | Baek et al. |
| 2010/0065836 A1 | 3/2010 | Lee et al. |
| 2010/0084741 A1 | 4/2010 | Andres |
| 2010/0085798 A1 | 4/2010 | Lu et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243983 A1 | 9/2010 | Chiang et al. |
| 2010/0258782 A1 | 10/2010 | Kuse et al. |
| 2011/0059576 A1 | 3/2011 | Cho et al. |
| 2011/0128775 A1 | 6/2011 | Maejima et al. |
| 2011/0171836 A1 | 7/2011 | Xia |
| 2011/0193044 A1 | 8/2011 | Sandhu et al. |
| 2011/0261606 A1 | 10/2011 | Sandhu et al. |
| 2011/0261607 A1 | 10/2011 | Tang et al. |
| 2012/0140542 A1 | 6/2012 | Liu |
| 2012/0164798 A1 | 6/2012 | Sills et al. |

FOREIGN PATENT DOCUMENTS

| | | |
|---|---|---|
| CN | 1624803 | 6/2005 |
| CN | 101005113 | 12/2006 |
| CN | 101051670 | 4/2007 |
| CN | 101034732 | 9/2007 |
| CN | 200880124714.6 | 7/2012 |
| EP | 1796103 | 9/2006 |
| JP | 2005-0008353 | 1/2005 |
| JP | 2005175457 | 6/2005 |
| JP | 2006032729 | 2/2006 |
| JP | 2006040981 | 2/2006 |
| JP | 2006074028 | 3/2006 |
| JP | 2006121044 | 5/2006 |
| JP | 2008-192995 | 8/2008 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 2010-0078808 | 7/2010 |
| KR | 20100083402 | 7/2010 |
| TW | 097147549 | 5/2013 |
| WO | WO 2006/003620 | 1/2006 |
| WO | PCT/US2008/084422 | 3/2009 |
| WO | WO 2009/127187 | 10/2009 |
| WO | WO 2010/068221 | 6/2010 |
| WO | PCT/US2008/084422 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | PCT/US2011/059095 | 6/2011 |
| WO | PCT/US2011/035601 | 11/2011 |
| WO | PCT/US2011/051785 | 4/2012 |
| WO | PCT/US2011/059095 | 5/2012 |
| WO | PCT/US2012/021168 | 7/2012 |
| WO | PCT/US2011/066770 | 9/2012 |
| WO | PCT/US2011/035601 | 12/2012 |
| WO | PCT/US2011/051785 | 4/2013 |

OTHER PUBLICATIONS

Baek et al., "Multi-layer Cross-point Binary Oxide Resistive Memory (OxRRAM) for Post-NAND Storage Application", IEEE, 2005.

Bedeschi et al., "A Bipolar-Selected Phase Change Memory Featuring Multi-Level Cell Storage", IEEE, vol. 44, No. 1, Jan. 2009, pp. 217-227.

Chen et al., "Non-Volatile Resistive Switching for Advanced Memory Applications", IEEE, 2005, 4 pages.

Chen et al., "Perovskite RRAM Devices with Metal/Insulator/PCMO/Metal Heterostructuers", IEEE, 2005, pp. 125-128.

Choi et al., "Defect Structure and Electrical Properties of Single-Crystal Ba0.03SR0.97TiO3", J. Am. Ceram. Soc., 71, [4], pp. 201-205, 1988.

Courtade et al., "Microstructure and resistance switching in NiO binary oxide films obtained from Ni oxidation", IEEE, 2006, pp. 94-99.

Ho et al., "A Highly Reliable Self-Aligned Graded Oxide WOx Resistance Memory: Conduction Mechanisms and Reliability", 2007 Symposium on VLSI Technology Digest of Technical Papers, pp. 228-229.

Hudgens et al., "Overview of Phase-Change Chalcogenide Nonvolatile Memory Technology", MRS Bulletin, Nov. 2004, pp. 829-832.

Ignatiev et al., "Resistance Non-volatile Memory-RRAM" Mater. Res. Soc. Symp. Proc., vol. 997, 2007, Materials Research Society, 9 pages.

Karg et al., "Nanoscale Resistive Memory Device Using SrTiO3 Films", IEEE, 2007, pp. 68-70.

Kau et al., "A Stackable cross point phase change memory", IEEE, 2009, pp. 27.1.1-27.1.4.

Komori et al., Disturbless flash memory due to high boost efficiency on BiCS structure and optimal memory film stack for ultra high density storage device; Dec. 2008; pp. 851-854.

Kooij et al., "Photoselective Metal Deposition on Amorphous Silicon p-i-n Solar Cells", Electrochemical Society Letters, Journal of electrochemical society vol. 44, No. 10, Oct. 1997, pp. L271-L272.

Kozicki, "Memory Devices Based on Solid Electrolytes" Mater. Res. Soc. Symp. Proc. vol. 997, 2007, Materials Research Society, 10 pages.

Lee et al., "2-stack 1D-1R Cross-point Structure with Oxide Diodes as Switch Elements for High Density Resistance RAM Applications", IEEE, 2007 pp. 771-774.

Lin et al., "Effect of Top Electrode Material on Resistive Switching Properties of ZrO2 Film Memory Devices", IEEE, May 2007, vol. 28, No. 5, pp. 366-368.

(56) References Cited

OTHER PUBLICATIONS

Meyer et al., "Oxide Dual-Layer Memory Element for Scalable Non-Volatile Cross-Point Memory Technology", IEEE, 2008, 5 pages.

Miyashita et al., "A Novel Bit-Line Process using Poly-Si Masked Dual-Damascene (PMDD) for 0.13 um DRAMs and Beyond", IEEE, 2000, pp. 15.4.1-15.4.4.

Muller et al., "Emerging Non-Volatile Memory Technologies", IEEE, 2003, pp. 37-44.

Oh, "Full Integration of Highly Manufacturable 512Mb PRAM based on 90nm Technology" 2006 IEEE, 4 pages.

Pein et al., "Performance of the 3-D PENCIL Flash EPROM Cell and Memory Array", IEEE, 1995, pp. 1982-1991.

Pellizzer et al., "A 90nm Phase Change Memory Technology for Stand-Alone Non-Volatile Memory Applications", IEEE, 2006, Symposium on VLSI Technology Digest of Technical Papers, 2 pages. Abstract Only.

Pirovano et al., "Self-Aligned u Trench Phase-Change Memory Cell Architecture fo 90nm Technology and Beyond", IEEE, 2007, pp. 222-225. Abstract Only.

Scheck et al., "Selective Metal Electrodeposition through doping modulation of semiconductor surfaces", Applied Physics Letters 86, 2005, 3 pgs.

Wikipedia, Despotuli et al., "Programmable Metallization Cell", pp. 1-4, Dec. 11, 2007, Place of Publication: Internet.

Wuttig, "Towards a Universal Memory?" Nature Materials, vol. 4, Apr. 2005, pp. 265-266.

Xing et al., "Characterization of AlGaN//GaN p-n Diodes with Selectively Regrown n-AlGaN by Metal-Organic Chemical-Vapor Deposition and its Application to GaN-Based Bipolar Transistors", Journal of Applied Physics 97, 2005, 4 pgs.

Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.

Yoon et al., "Vertical Cross-point Resistance Change Memory for Ultra-High Density Non-volatile Memory Applications", 2009 Symposium on VLSI Technology Digest of Technical Papers, pp. 26-27.

Yu et al., "Structure Effects on Resistive Switching of Al/TiOx/Al Devices for RRAM Applications", IEEE, 2008, pp. 331-333.

Higaki et al., "Effects of Gas Phase Absorption into Si Substrates on Plasma doping Process" A208; Jan. 2004.

Hosoi et al., "High Speed Unipolar Switching Resistance RAM (RRAM) Technology", Advanced Materials Res. Lab, Japan; Correlated Electron Res. Center (CERC), Japan; Nanotechnology Res. Inst. (NRI), Japan, Dec. 2006; 4 pages.

Kozicki et al., "Non-Volatile Memory Based on Solid Electrolytes" Center for Solid State Electronics Research, Arizona State University, Nov. 2004; 8 pgs.

Lee et al., "Resistance Switching of Al doped ZnO for Non Volatile Memory Applications", Dept of Materials Science and Engineering, Gwangju Institute of Science and Technology, May 2006; 2 pages.

METHODS OF FORMING A NONVOLATILE MEMORY CELL AND METHODS OF FORMING AN ARRAY OF NONVOLATILE MEMORY CELLS ARRAY OF NONVOLATILE MEMORY CELLS

RELATED PATENT DATA

This patent resulted from a divisional application of U.S. patent application Ser. No. 12/979,189, filed Dec. 27, 2010, entitled "Methods Of Forming A Nonvolatile Memory Cell And Methods Of Forming An Array Of Nonvolatile Memory Cells Array Of Nonvolatile Memory Cells", naming Scott E. Sills and Gurtej S. Sandhu as inventors, the disclosure of which is incorporated by reference.

TECHNICAL FIELD

Embodiments disclosed herein pertain to methods of forming a nonvolatile memory cell and to methods of forming an array of nonvolatile memory cells.

BACKGROUND

Memory is one type of integrated circuitry, and is used in computer systems for storing data. Such is usually fabricated in one or more arrays of individual memory cells. The memory cells might be volatile, semi-volatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two current conductive electrodes having a programmable material received there-between. The programmable material is selected or designed to be configured in a selected one of at least two different states to enable storing of information by an individual memory cell. The reading of the cell comprises determination of which of the states the programmable material is in, and the writing of information to the cell comprises placing the programmable material in a predetermined state. Some programmable materials retain a state in the absence of refresh, and thus may be incorporated into nonvolatile memory cells.

Some programmable materials may contain mobile charge carriers larger than electrons and holes, for example ions in some example applications. Regardless, the programmable materials may be converted from one memory state to another by moving the mobile charge carriers therein to alter a distribution of charge density within the programmable materials. Some example memory devices that utilize ions as mobile charge carriers are resistive RAM (RRAM) cells, which can include classes of memory cells containing multivalent oxides, and which can include memristors in some specific applications. Other example memory devices that utilize ions as charge carriers are programmable metallization cells (PMCs); which may be alternatively referred to as a conductive bridging RAM (CBRAM), nanobridge memory, or electrolyte memory.

The RRAM cells may contain programmable material sandwiched between a pair of electrodes. The programming of the RRAM cells may comprise transitioning the programmable material between first a memory state in which charge density is relatively uniformly dispersed throughout the material and a second memory state in which the charge density is concentrated in a specific region of the material (for instance, a region closer to one electrode than the other).

A PMC may similarly have programmable material sandwiched between a pair of current conductive electrodes. The PMC programmable material comprises ion conductive material, for example a suitable chalcogenide or any of various suitable oxides. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across the electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

Other example programmable materials are organic, for example which may change between or among memory states by switching via localized redox reactions, charge transfer reactions, or electronic transitions. Examples include certain polymers, self-assembled molecular monolayers, carbonaceous materials, organic-metal complexes, and blends or layered stacks thereof.

DETAILED DESCRIPTION OF EXAMPLE EMBODIMENTS

Figure 1:
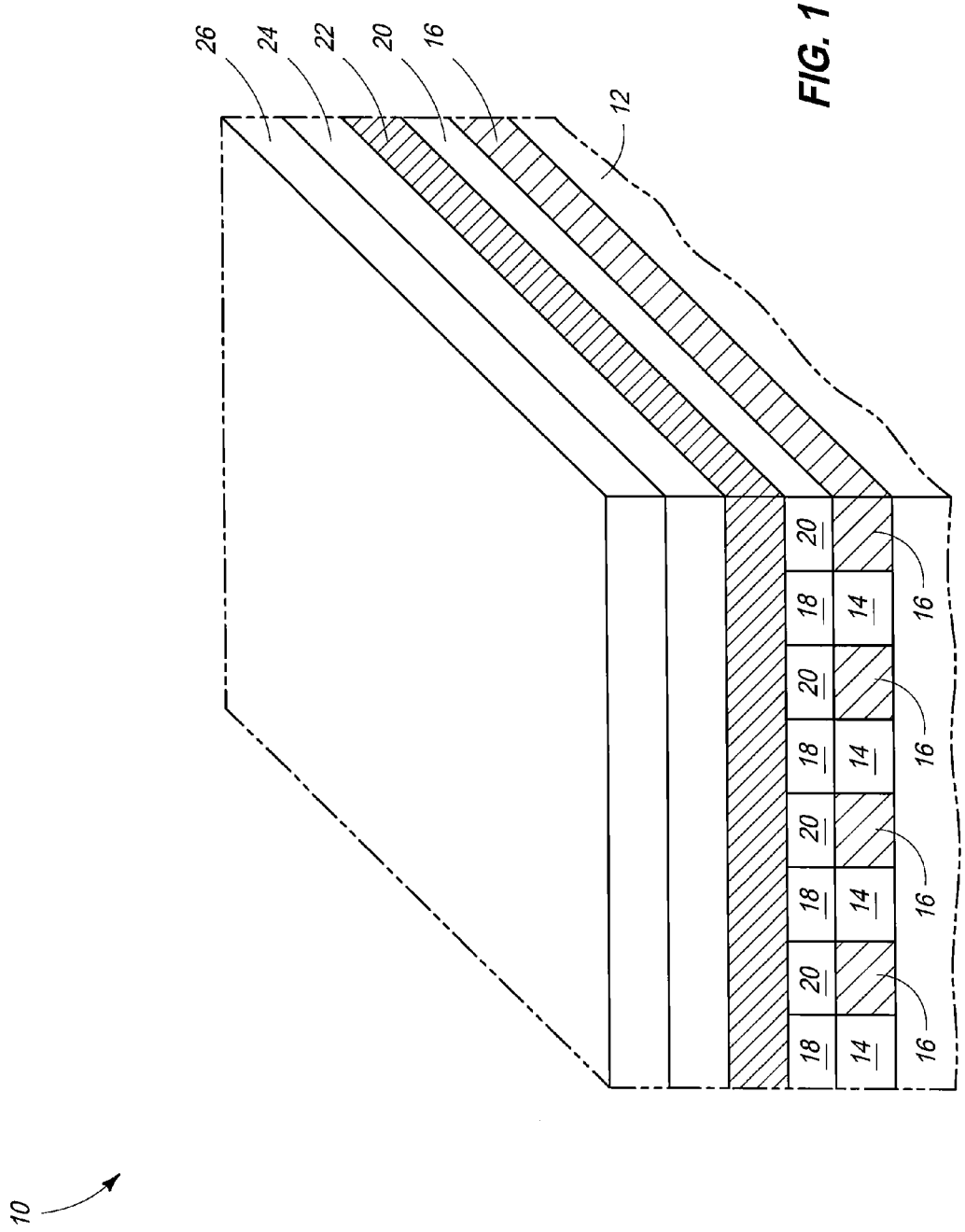
FIG. 1 is a diagrammatic isometric view of a fragment of a substrate in process in accordance with an embodiment of the invention.

Example embodiments of a method of forming a nonvolatile memory cell, including forming an array of such cells, is initially described with reference to FIGS. 1-6. Referring to FIG. 1, an example substrate fragment 10 in process is shown. In one embodiment, substrate 10 comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

FIG. 1 shows a portion of an array area within which a plurality of nonvolatile memory cells will be fabricated. Logic circuitry (not shown) would typically be fabricated outside of the array area. Control and/or other peripheral circuitry (not shown) for operating the memory array may or may not wholly or partially be received within the array area, with an example array area as a minimum encompassing all of the memory cells of a given array/sub-array. Further, multiple sub-arrays might also be fabricated and operated independently, in tandem, or otherwise relative one another. As used in this document, a "sub-array" may also be considered as an array. FIG. 1 is but one example substrate fragment, with other existing or yet-to-be-developed substrates being usable.

Substrate 10 comprises a suitable base substrate 12 which may be homogenous or non-homogenous, for example comprising multiple different composition materials and/or layers. As an example, such may comprise bulk monocrystalline silicon and/or a semiconductor-on-insulator substrate. As an additional example, such may comprise dielectric material having conductive contacts or vias formed therein which extend vertically or otherwise into current conductive electrical connection with electronic device components, regions, or material received elevationally inward of the dielectric material. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further in this document, "elevational" and "elevationally" are with reference to the vertical direction from a base substrate upon which the circuitry is fabricated, for example, base substrate 12.

A plurality of horizontally oriented first electrode lines 16 is received over base substrate 12. Dielectric material 14 is also received over base substrate 12 between first electrode lines 16. Electrode lines 16 comprise current conductive material and may be homogenous or non-homogenous. In the context of this document, "current conductive material" is a composition where electric current flow would inherently occur therein predominantly by movement of subatomic positive and/or negative charges when such are generated, as opposed to predominantly by movement of ions. Example current conductive materials are elemental metals, alloys of elemental metals, current conductive metal compounds, and conductively doped semiconductive material, including any combinations thereof. Example suitable dielectric material 14 includes silicon nitride and doped or undoped silicon dioxide, such as boron/or phosphorous doped silicate glasses. Dielectric material 14 may be homogenous or non-homogenous. First electrode lines 16 with dielectric material 14 there-between may be fabricated by any existing or yet-to-be-developed manner(s). Subtractive patterning and etch, and/or damascene-like methods are but two examples.

Dielectric material 18 and sacrificial material 20 have been formed over base substrate 12. Each may be homogenous or non-homogenous, and dielectric material 18 may be the same as or different from composition(s) of dielectric material 14. Sacrificial material 20 may be any one or combination of electrically insulative, electrically conductive, and semiconductive. In the FIG. 1 example, dielectric material 18 has been formed over and directly against dielectric material 14, and sacrificial material 20 has been formed over and directly against first electrode lines 16. In this document, a material or structure is "directly against" another when there is at least some physically touching contact of the stated materials or structures relative one another. In contrast, "over" encompasses "directly against" as well as constructions where intervening material(s) or structure(s) result(s) in no physical touching contact of the stated materials or structures relative one another. In one example embodiment and as shown, sacrificial material 20 has been formed to comprise sacrificial lines which are elevationally outward of and laterally coincident with first electrode lines 16. Ideally, sacrificial material 20 is selectively etchable relative to underlying and overlying material. In the context of this document, a selective etch requires removal of one material relative to a stated or shown other material at a ratio of at least 1.5:1. Further in this document, a selective deposition requires formation on one material relative to a stated or shown other material at a ratio of at least 1.5:1.

Still referring to FIG. 1, current conductive material 22 has been formed over, and in one embodiment directly against, dielectric material 18 and sacrificial material 20. Such may be homogenous or non-homogenous, and may be of the same or different composition(s) as that of first electrode lines 16.

Figure 2:
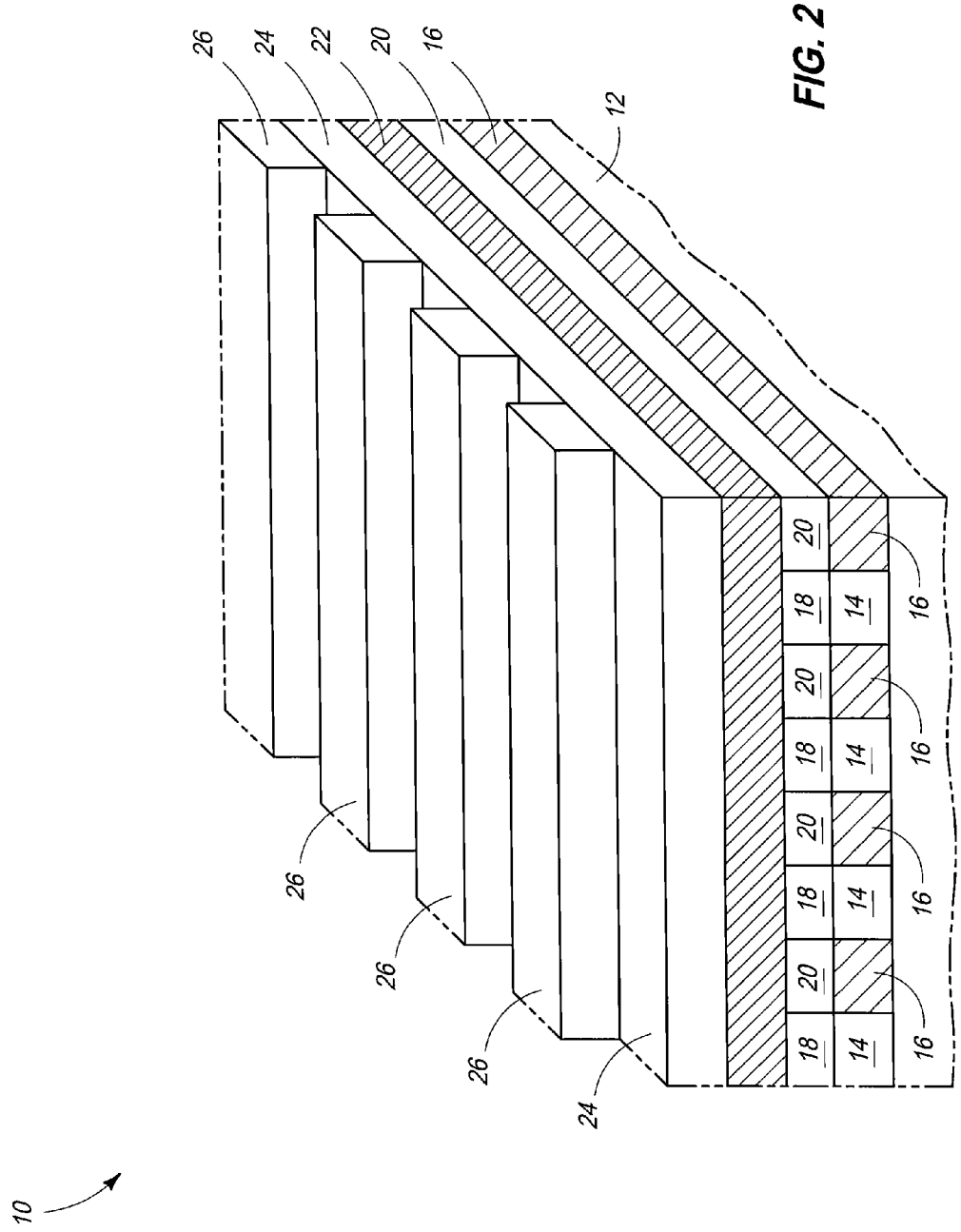
FIG. 2 is a view of the FIG. 1 substrate at a processing step subsequent to that shown by FIG. 1.

Hard-masking material 24 and patterning material 26 have been formed elevationally outward of current conductive material 22. Each may be homogenous or non-homogenous, with an example hard-masking material being silicon nitride and an example patterning material being photoresist. FIG. 2 shows patterning material 26 as having been formed into a series of lines which, in one embodiment, are parallel relative one another and generally orthogonal to first electrode lines 16.

Figure 3:
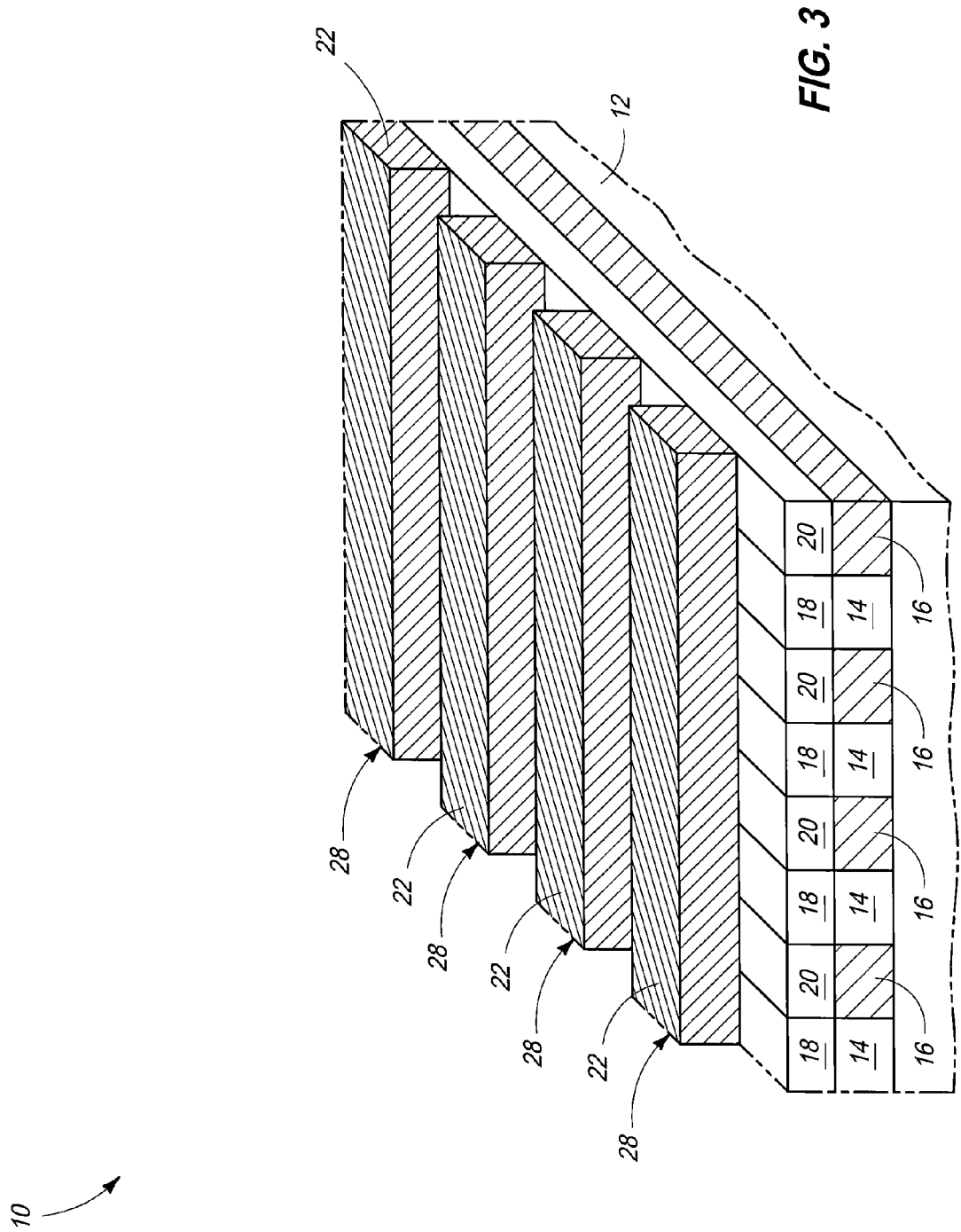
FIG. 3 is a view of the FIG. 2 substrate at a processing step subsequent to that shown by FIG. 2.

Referring to FIG. 3, the pattern of FIG. 2 has been substantially transferred elevationally inward to form a plurality of horizontally oriented second electrode lines 28 from current conductive material 22. Second electrode lines 28 are elevationally outward of first electrode lines 16 with sacrificial material 20 being received there-between. Hard-masking material 24 and/or material 26 may or may not be removed at this point or later in the process, with such being shown as having been removed in FIG. 3.

Figure 4:
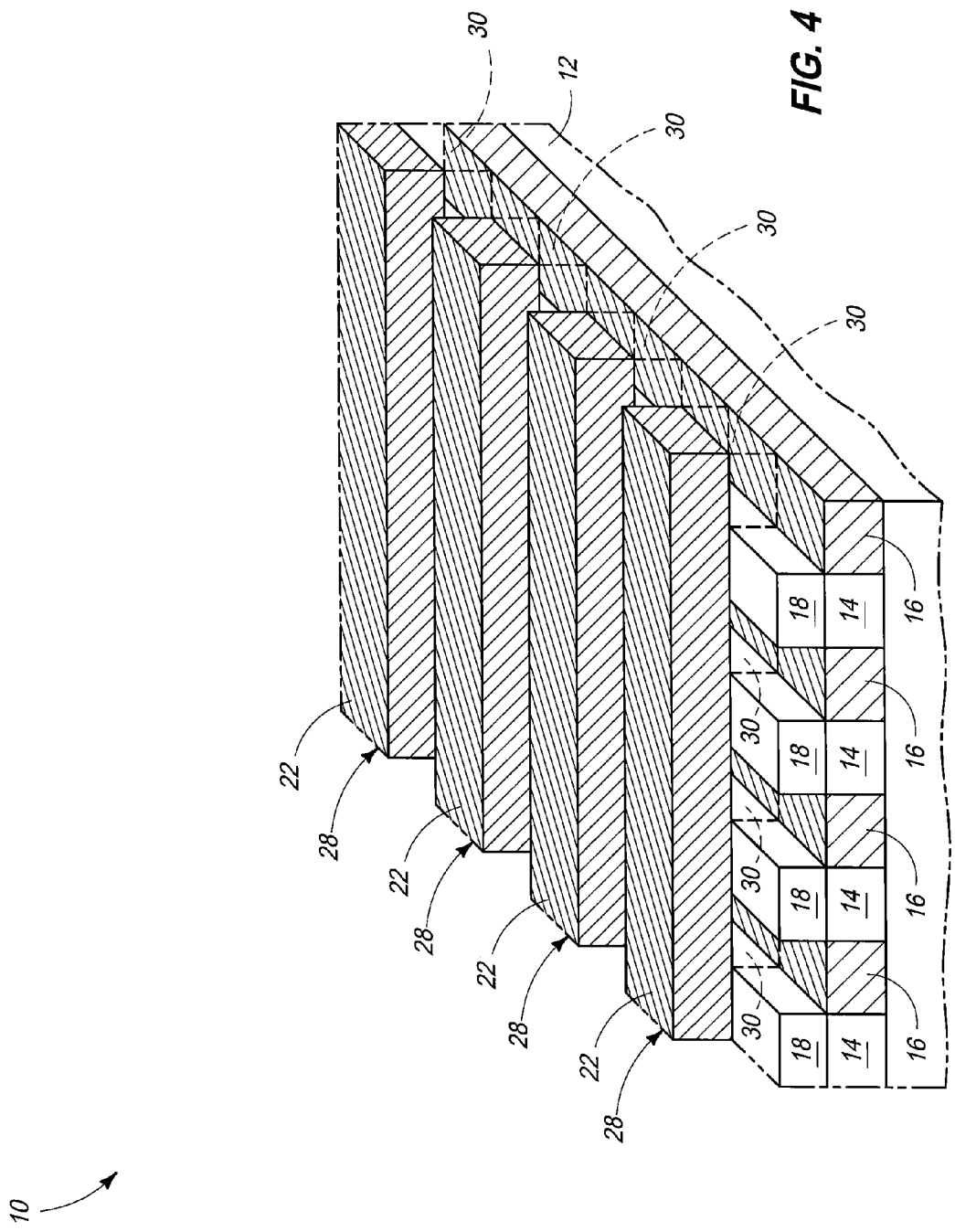
FIG. 4 is a view of the FIG. 3 substrate at a processing step subsequent to that shown by FIG. 3.

Referring to FIG. 4, sacrificial material 20 (not shown) has been removed from between first electrode lines 16 and second electrode lines 28 where such cross to leave a cavity or void space 30 elevationally between the first and second electrode lines. Such may be conducted by any existing or yet-to-be-developed technique. Examples include wet chemical etching, dry chemical etching, solvent dissolution, and thermodynamic treatment (including any combinations thereof) depending on composition of the sacrificial material. Ideally, such removal is conducted selectively relative to exposed materials 16, 18, and 22.

Figure 5:
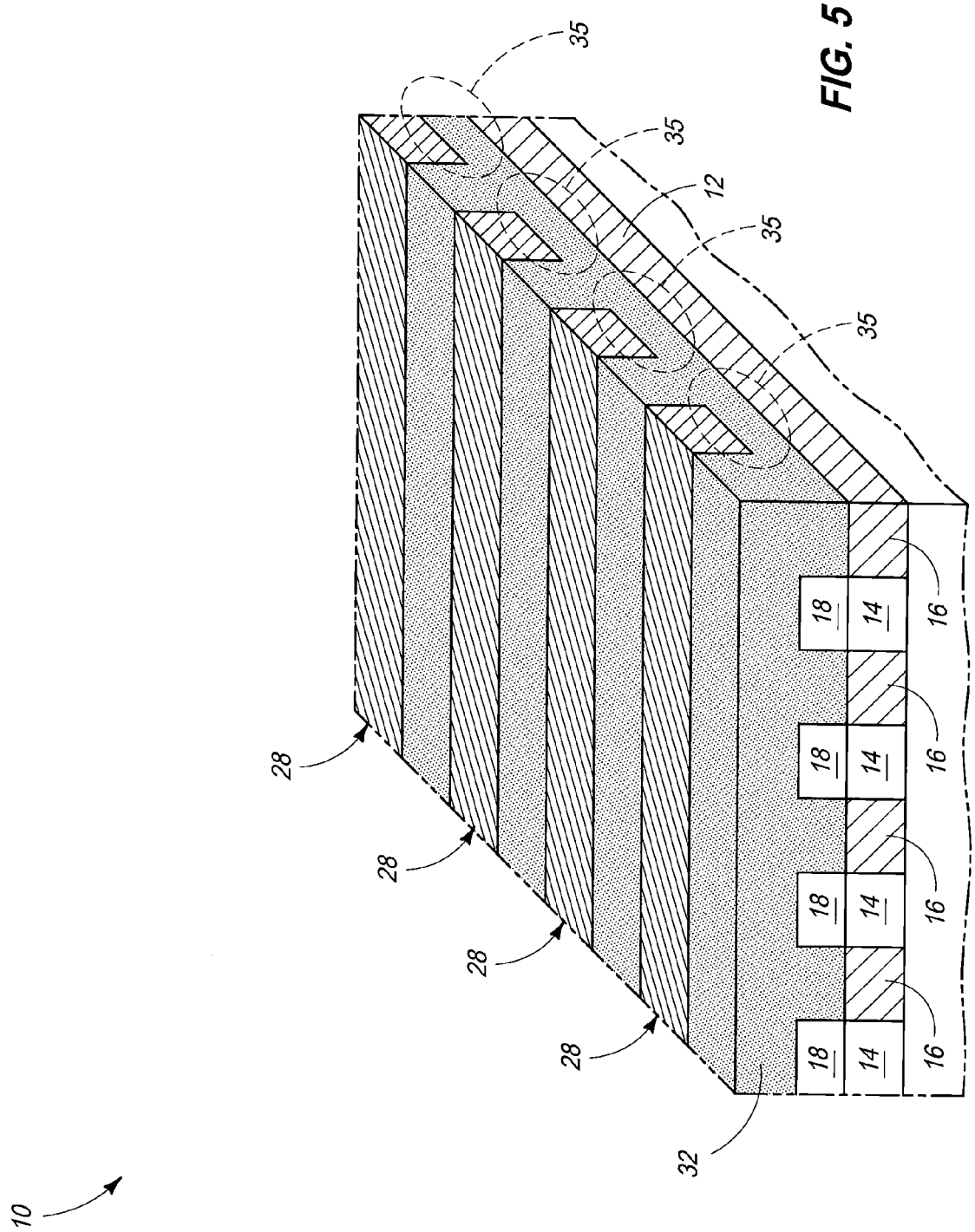
FIG. 5 is a view of the FIG. 4 substrate at a processing step subsequent to that shown by FIG. 4.

Referring to FIG. 5, programmable material 32 has been formed elevationally between first electrode lines 16 and second electrode lines 28 at least where such cross. Such may be solid, gel, amorphous, crystalline, or any other suitable phase, and may be homogenous or non-homogenous. Any existing or yet-to-be developed programmable material 32 may be used, with only some examples being provided below.

One example programmable material is ion conductive material. Example suitable such materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and $CuTe$) and/or oxides such as zirconium oxide, hafnium oxide, tungsten oxide, copper oxide, niobium oxide, iron oxide, silicon oxide (specifically, silicon dioxide), gadolinium oxide, etc. capable of inherently (or with additive) supporting electrolyte behavior. Such may have silver, copper, cobalt, and/or nickel ions, and/or other suitable ions, diffused therein for ionic conduction, analogously to structures disclosed in U.S. Pat. No. 7,405,967 and U.S. Patent Publication Number 2010/0193758.

Additional example programmable materials include multi-resistive state metal oxide-comprising material. Such may comprise, for example, at least two different layers or regions generally regarded as or understood to be active or passive regions, although not necessarily. Alternately, such may only comprise active material. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $SrZrO_3$, $BaTiO_3$, $Ba_{(1-x)}Sr_xTiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, a programmable material composite might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed.

The programmable material may comprise memristive material. As an example, such material may be statically programmable semiconductive material which comprises mobile dopants that are received within a dielectric such that the material is statically programmable between at least two different resistance states. At least one of the states includes localization or gathering of the mobile dopants such that a dielectric region is formed and thereby provides a higher resistance state. Further, more than two programmable resistance states may be used. In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. More than one type of mobile dopant may be used. Example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$. Example programmable materials that comprise oxygen vacancies as mobile dopants may comprise a combination of $TiO_2$ and $TiO_2$, in at least one programmed resistance state depending on location of the oxygen vacancies and the quantity of the oxygen vacancies in the locations where such are received. An example programmable material that comprises nitrogen vacancies as mobile dopants is a combination of ALN and $AlN_{1-x}$ in at least one programmed state depending on location of the nitrogen vacancies and the quantity of the nitrogen vacancies in the locations where such are received. An example programmable material that comprises fluorine vacancies as mobile dopants may is a combination of $MgF_2$ and $MgF_{2-x}$ in at least one programmed resistance state depending on location of the fluorine vacancies and the quantity of the fluorine vacancies in the locations where such are received. As another example, the mobile dopants may comprise aluminum atom interstitials in a nitrogen-containing material.

Still other example programmable materials include organic materials and organic-metal complexes, such as Bengala Rose, $AlQ_3Ag$, Cu-TCNQ, DDQ, TAPA, fluorescine-based polymers, poly(vinylidene fluoride-ran-trifluoroethylene), rotaxanes, catenanes, amino diethylphenylnitrobenzenethiolate, amorphous carbon, and graphene.

The programmable material, as well as other materials disclosed herein, may be deposited by any existing or yet-to-be-developed technique(s). Examples include vapor phase deposition (i.e., chemical vapor phase deposition, atomic layer deposition, and/or physical vapor deposition) and/or liquid phase deposition, either of which may be selective or non-selective to one or more underlying materials. In example liquid-phase depositions, surface mediated transport (capillarity) and or electrokinetic flow may occur. Wetting agents, surfactants, or other surface modification agents may or may not be used. Further and regardless of deposition method, any deposited material may be subsequently treated, for example annealed or irradiated. Such treatment(s) may or may not induce a chemical reaction that produces the desired memory cell material from deposited precursor materials.

Figure 6:
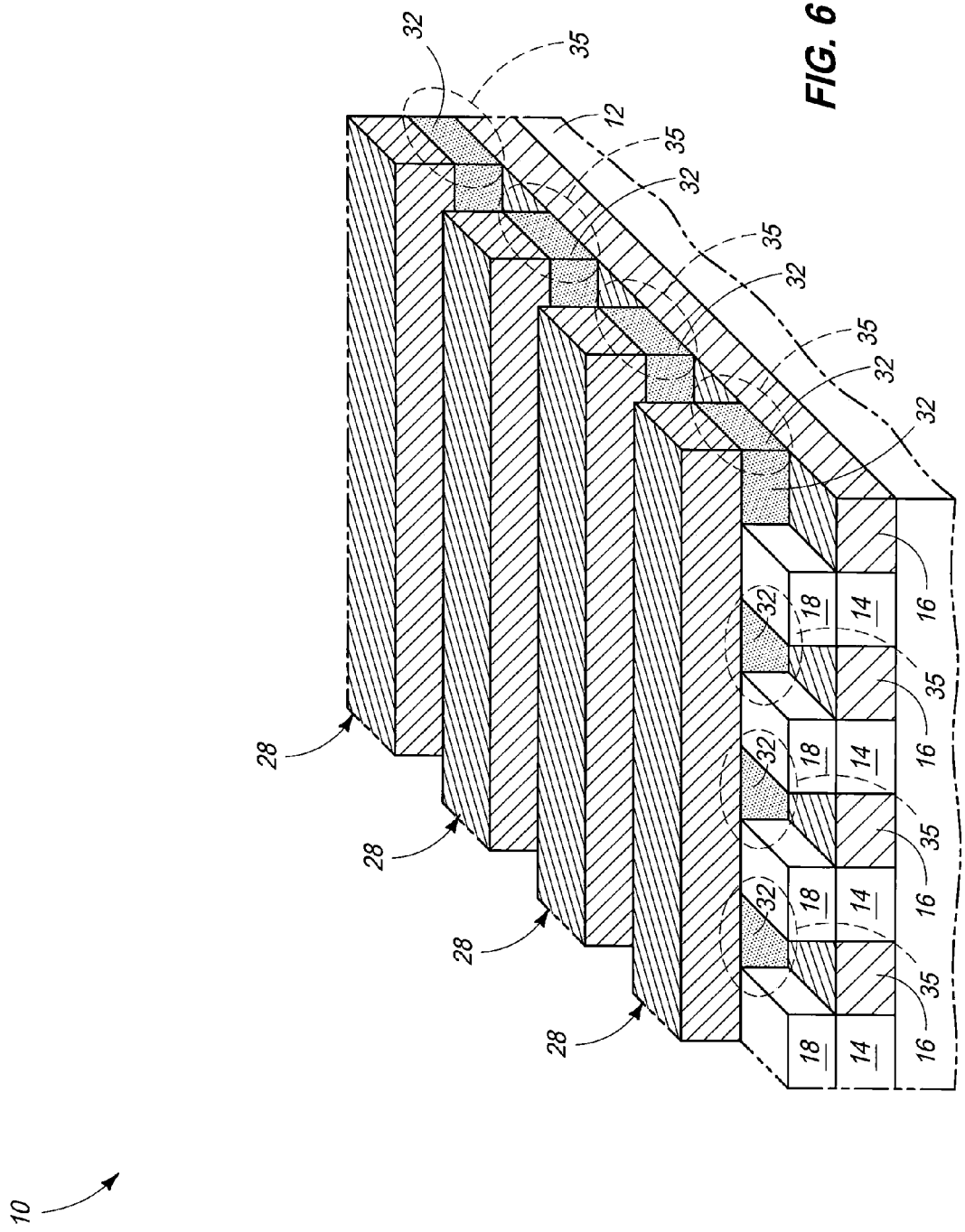
FIG. 6 in one embodiment is a view of the FIG. 5 substrate at a processing step subsequent to that shown by FIG. 5, and in another embodiment is an alternate processing to that depicted by FIG. 5.

Programmable material 32 may or may not be subsequently patterned after its formation. In one example, programmable material 32 may be blanketly deposited (i.e., non-selectively) over substrate 12, and subsequently planarized back relative to an outer surface of second electrode lines 28. The construction of FIG. 5 may result. Subsequent anisotropic or other etching thereof may or may not occur. FIG. 6 by way of example only, depicts subsequent anisotropic etching wherein remaining programmable material 32 may essentially only be received within former void spaces 30 of FIG. 4. Alternately, in some embodiments, essentially all of programmable material 32 as depicted in FIG. 5 may remain in the finished circuitry construction where, for example, material 32 inherently may be programmable in the vertical direction as opposed to the horizontal direction.

As an alternate example, programmable material may be formed by selective growth from at least one of the first and second electrode lines. For example, the embodiment of FIG. 6 might be produced from the embodiment of FIG. 4 by selective growth of programmable material 32 from one or both of electrode lines 28 and 16. As another example, the embodiment of FIG. 6 might be directly produced from the embodiment of FIG. 4 where the materials of lines 16 and 28 are of suitable different compositions and programmable material 32 is grown elevationally inward selectively from lines 28. Such may occur where sidewalls and tops of second electrode lines 28 are masked from such growth. Alternately as an example, growth may occur there-from followed by selective anisotropic etching of uncovered programmable material 32.

Figure 7:
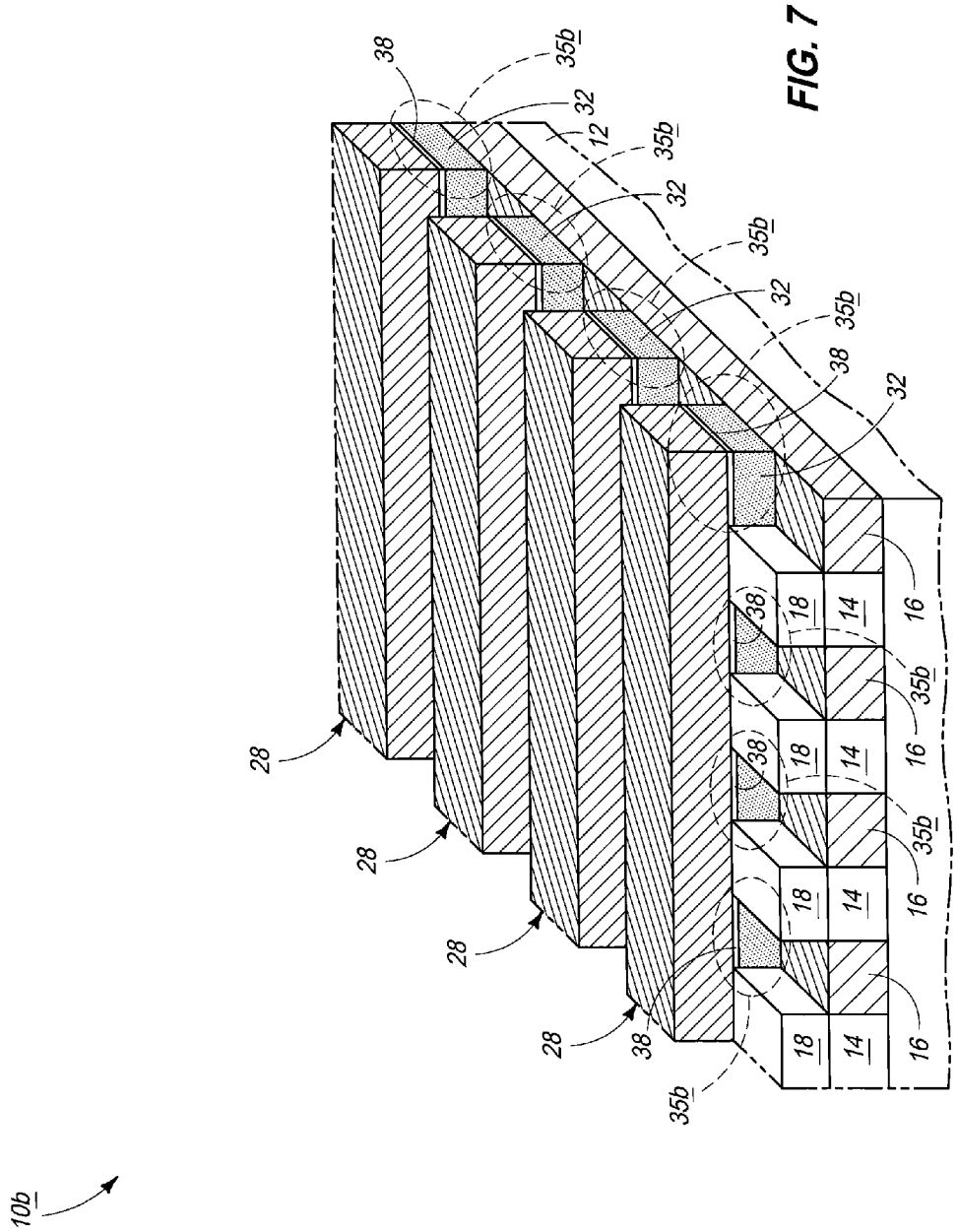
FIG. 7 is a diagrammatic isometric view of a substrate fragment in process in accordance with an embodiment of the invention.

Referring to FIGS. 5 and 6, each depicts formation of a plurality of individual nonvolatile memory cells 35. Such memory cells comprise a crossing first electrode line 16 and a second electrode line 28 including programmable material 32 received there-between where such cross. Additional components and/or material(s) may be associated with individual memory cells, such as one or more select devices. For example, FIG. 7 depicts an alternate embodiment substrate fragment 10b to that depicted by FIG. 6. Like numerals from the above-described embodiment have been used where appropriate, with some construction differences being indicated with the suffix "b" or with different numerals. Nonvolatile memory cells 35b in FIG. 7 comprise a select device 38. Any existing or yet-to-be-developed select device may be used, with transistors and diodes being but two examples. Select devices 38 may be homogenous or non-homogenous. Further, the material(s) of select device 38 may be formed before or after forming programmable material 32. Material(s) of select device 38 may be deposited blanketly and subsequently patterned. Alternately or additionally, such may be grown selectively from one or both of the first and second electrodes, and/or selectively from the programmable material where such is provided before forming material(s) of the select device. As an example with respect to FIG. 7, programmable material 32 may be formed before material 38, with material 38 either selectively grown inwardly from second electrode lines 28 or outwardly from programmable material 32.

Figure 8:
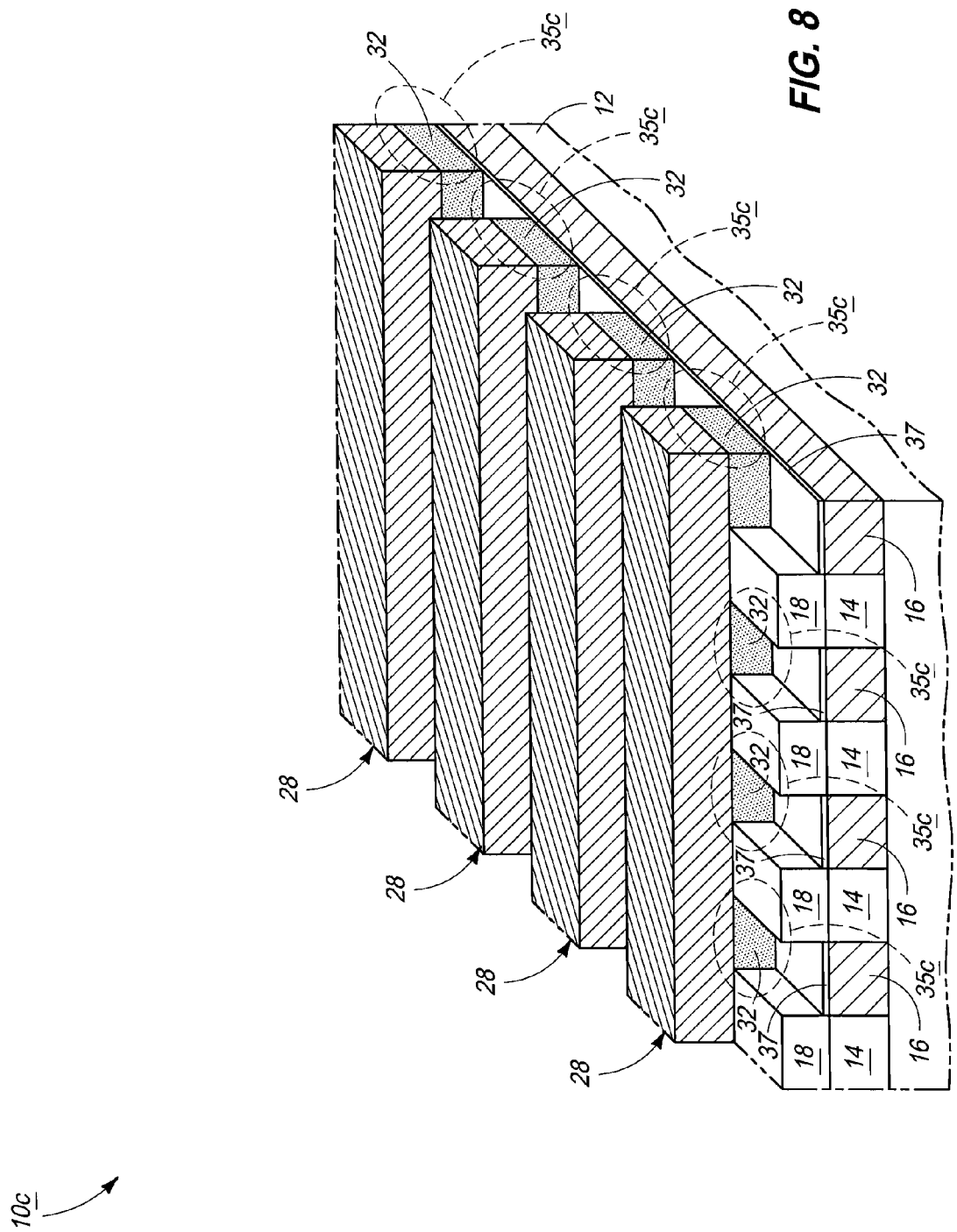
FIG. 8 is a diagrammatic isometric view of a substrate fragment in process in accordance with an embodiment of the invention.
Figure 9:
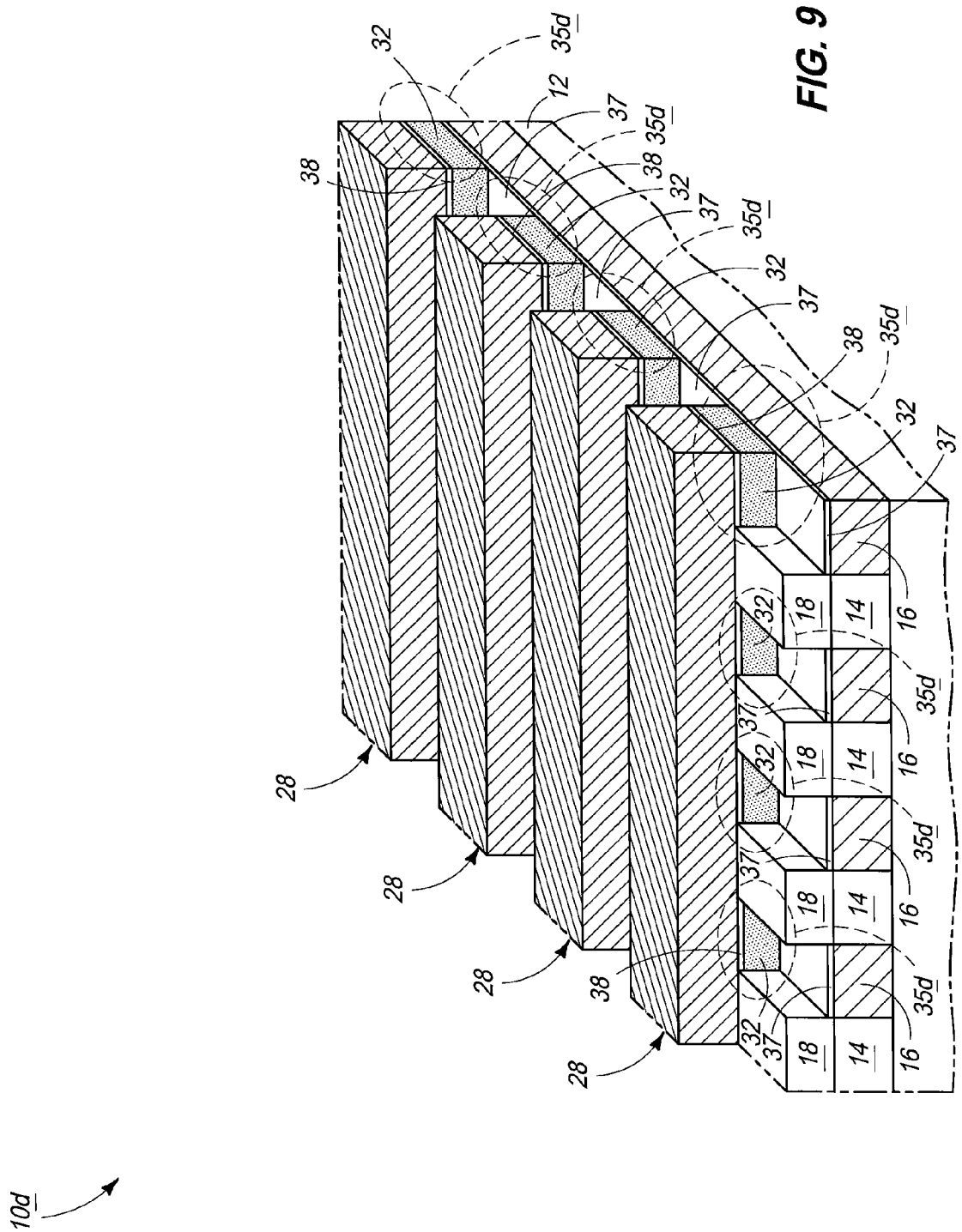
FIG. 9 is a diagrammatic isometric view of a substrate fragment in process in accordance with an embodiment of the invention.

FIG. 8 depicts an alternate processed substrate fragment 10c. Like numerals from the above-described embodiments have been used where appropriate, with some construction differences being indicated with the suffix "c" or with different numerals. In FIG. 8, select device material 37 of memory cells 35c has been formed directly against first electrodes 16, for example before or after forming programmable material 32. FIG. 9 illustrates yet an additional alternate example embodiment 10d. Like numerals from the above-described embodiments have been used where appropriate, with some construction differences being indicated with the suffix "d" or with different numerals. In FIG. 9, memory cells 35d comprise two select devices 37, 38 in addition to programmable material 32 and first and second electrodes 16 and 28, respectively.

Figure 10:
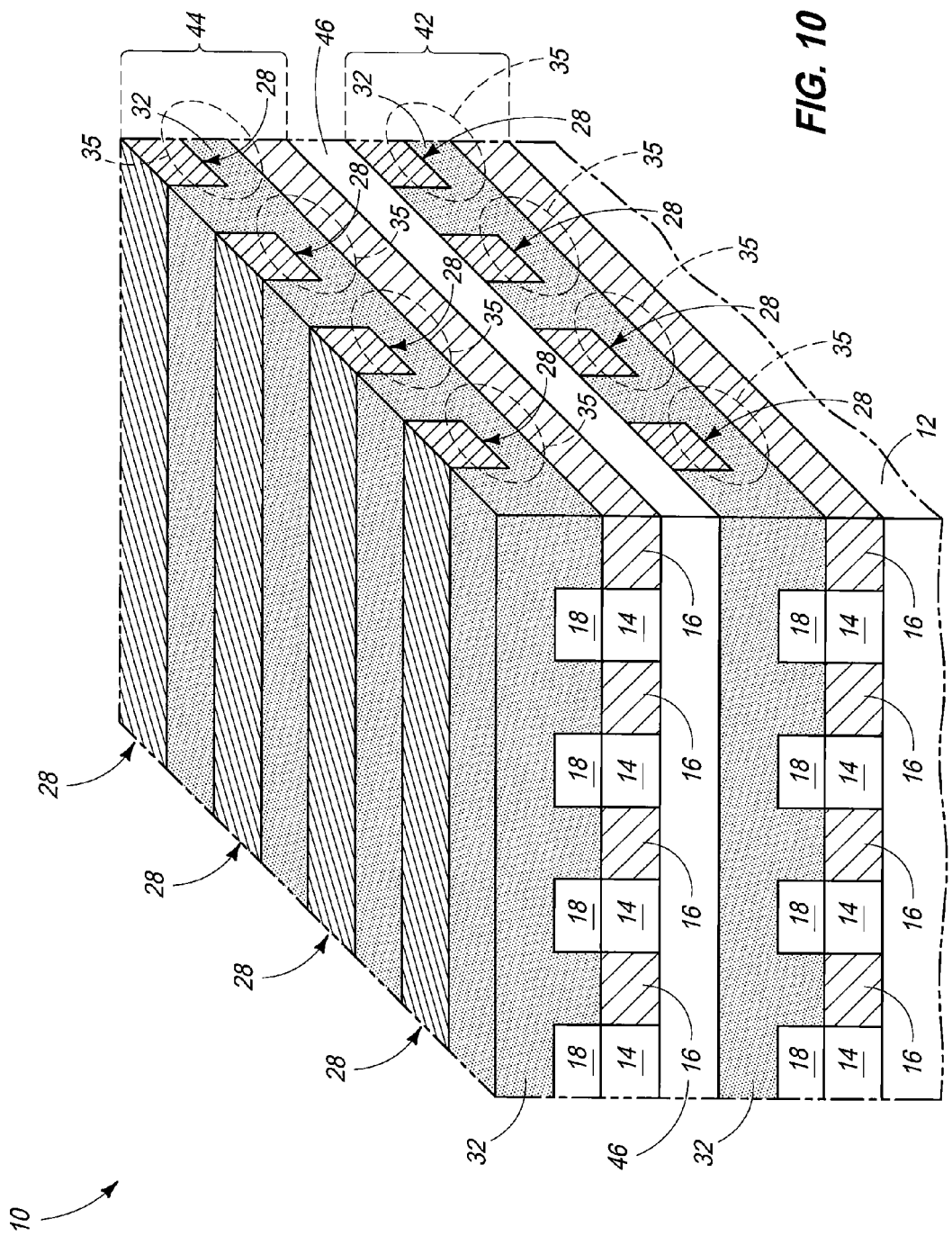
FIG. 10 is a view of the FIG. 5 substrate at a processing step subsequent to that shown by FIG. 5.

The processing as described above to produce any of the FIGS. 5-9 circuitry constructions, and other constructions, may be repeated or combined to form multiple vertically stacked tiers of nonvolatile memory cells of an array of such cells. For instance, first electrode lines 16, second electrode lines 28, programmable material 32, and select devices 38 and/or 37 where provided may comprise a single tier of multiple vertically stacked tiers of nonvolatile memory cells of an array. As an example, FIG. 10 depicts continued processing of substrate 10 from that of FIG. 5. Such shows multiple vertically stacked tiers 42, 44 of nonvolatile memory cells 35 of an array of such cells. Tier 42 comprises first electrode lines 16, programmable material 32, and second electrode lines 28. Another example such tier 44 has been formed outwardly thereof, with tiers 42 and 44 shown as being separated by any suitable dielectric material(s) 46. Additional tiers may be fabricated elevationally outward of tier 44.

Tier 44 and/or any additional tier fabricated outwardly thereof, may be formed with processing analogous to that shown with respect to tier 42, or otherwise. In one embodiment, the removing of sacrificial material and the forming of programmable material (and optionally select device material) for a respective individual of the vertically stacked tiers during fabrication of the array may occur one tier at a time. Alternately, such removing of the sacrificial material and the forming of programmable material (and optionally select device material) for the individual tiers may occur for multiple tiers at the same time, or for all tiers at the same time.

Figure 11:
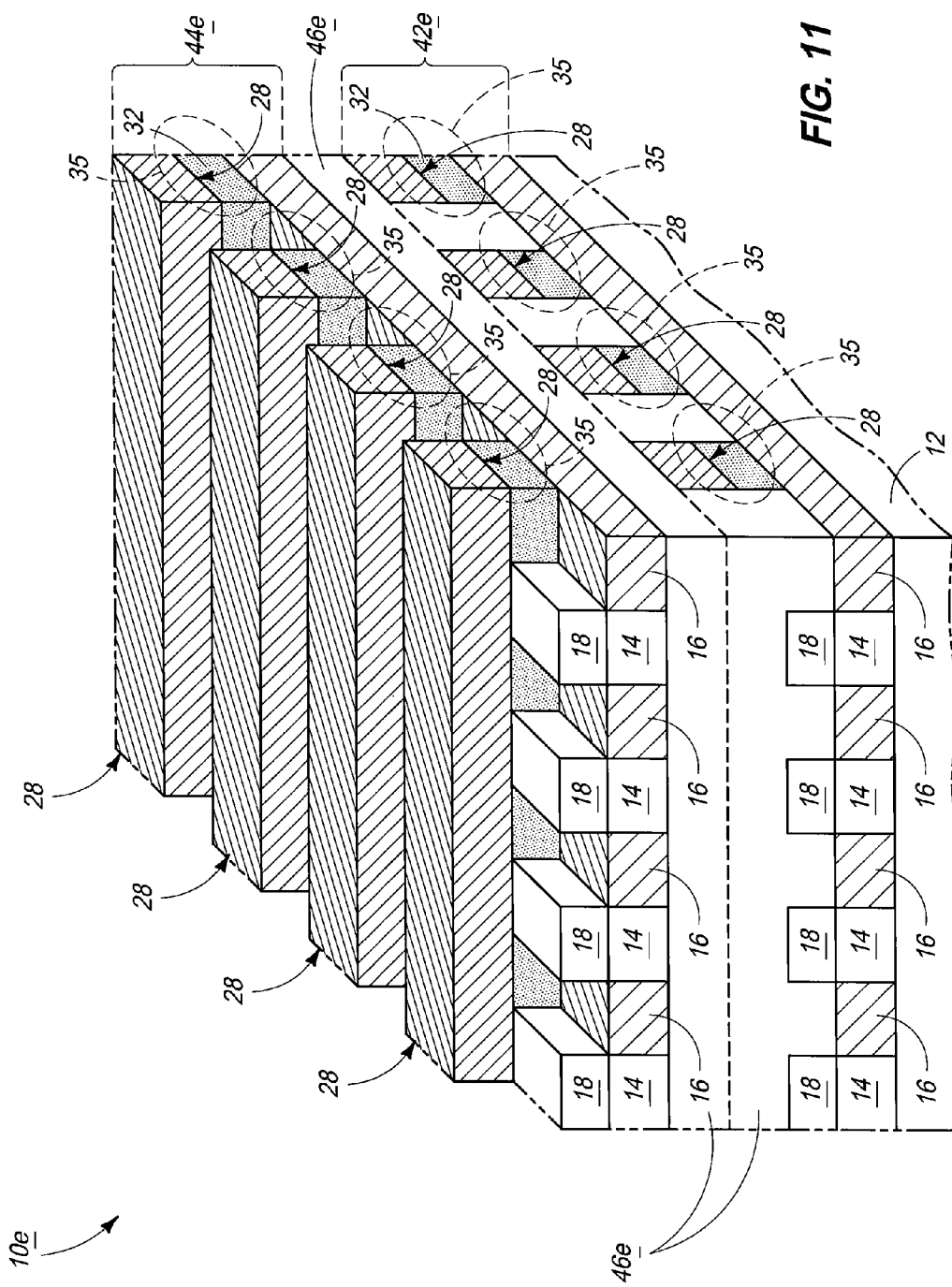
FIG. 11 is a view of the FIG. 6 substrate at a processing step subsequent to that shown by FIG. 6.
Figure 12:
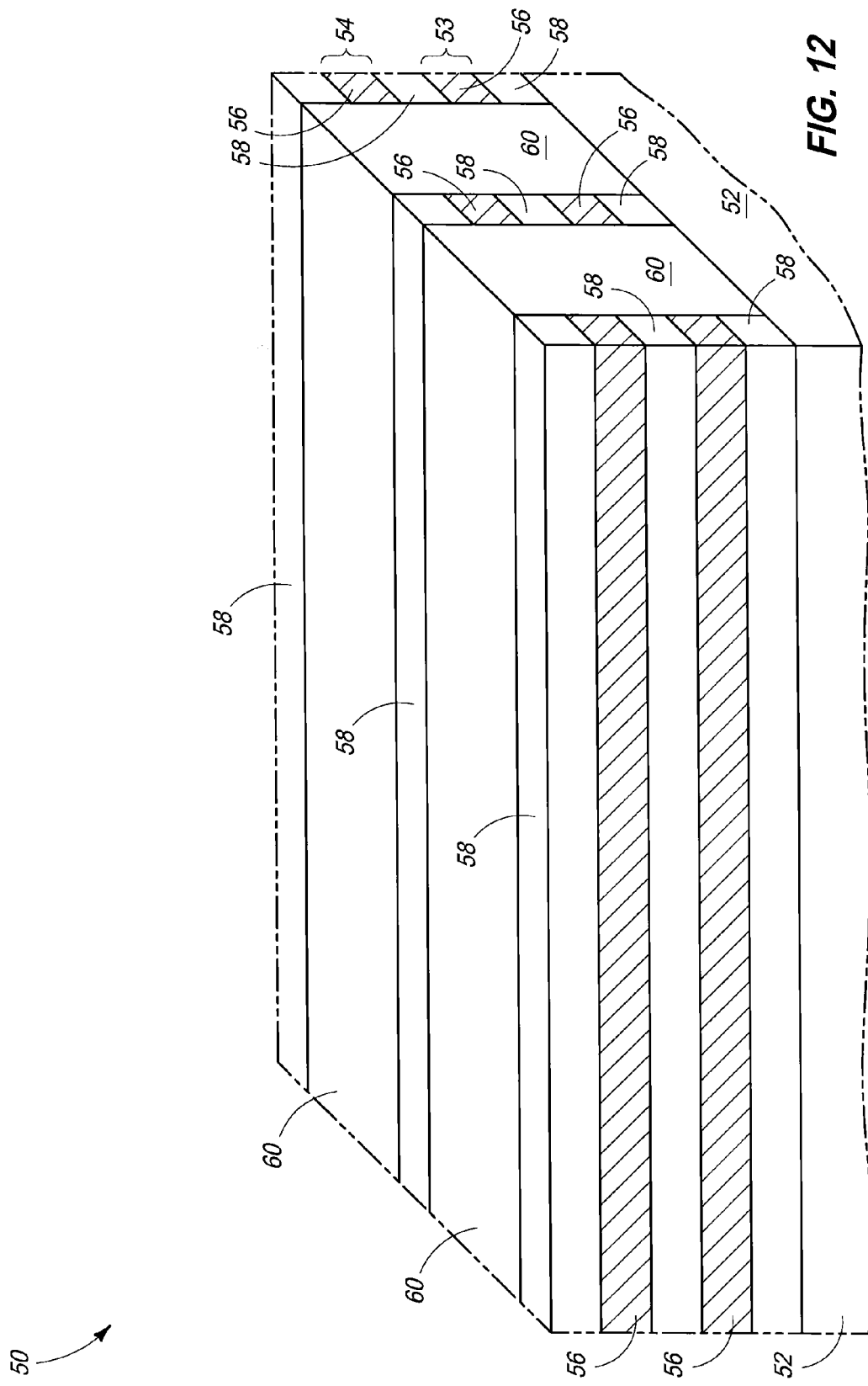
FIG. 12 is a diagrammatic isometric view of a substrate fragment in process in accordance with an embodiment of the invention.

FIG. 11 illustrates an alternate embodiment substrate fragment 10e to that shown by FIG. 10. Like numerals from the FIG. 10 embodiment have been used where appropriate, with some construction differences being indicated by the suffix "e". FIG. 11 depicts processing subsequent to that shown for the substrate of FIG. 6. Dielectric material(s) 46e has been provided between tiers 42e and 44e. For example, such may be homogenous or non-homogenous, and is shown as being deposited over tier 42e to fill gaps between individual memory cells therein and subsequently planarized before formation of tier 44e.

Individual tiers of a multiple stack of tiers of memory cells need not be of the same construction or processed the same relative one another, and may occur in accordance with any of the processing described above, or otherwise, with respect to the example embodiments of FIG. 1-9.

Additional embodiments of a method of forming an array of vertically stacked tiers of nonvolatile memory cells are next described with reference to FIGS. 12-21 with respect to a substrate 50. Such comprises a base substrate 52 analogous to or the same as a substrate 12 of the above-described embodiments. Multiple tiers 53, 54 have been formed over base substrate 52 and individually comprise a plurality of horizontally oriented first electrode lines 56. First electrode lines 56 may be as described above with respect to first electrode lines 16 of the first-described embodiments. Individual tiers 53 and 54 (and other tiers if fabricated outwardly thereof) may be separated elevationally by a first dielectric composition 58. First electrode lines 56 within an individual tier may be separated laterally by a second dielectric 60. First and second dielectrics 58, 60, respectively, may themselves be homogenous or non-homogenous. In one embodiment, such are of different composition to enable selectively etching of one relative to the other.

Figure 13:
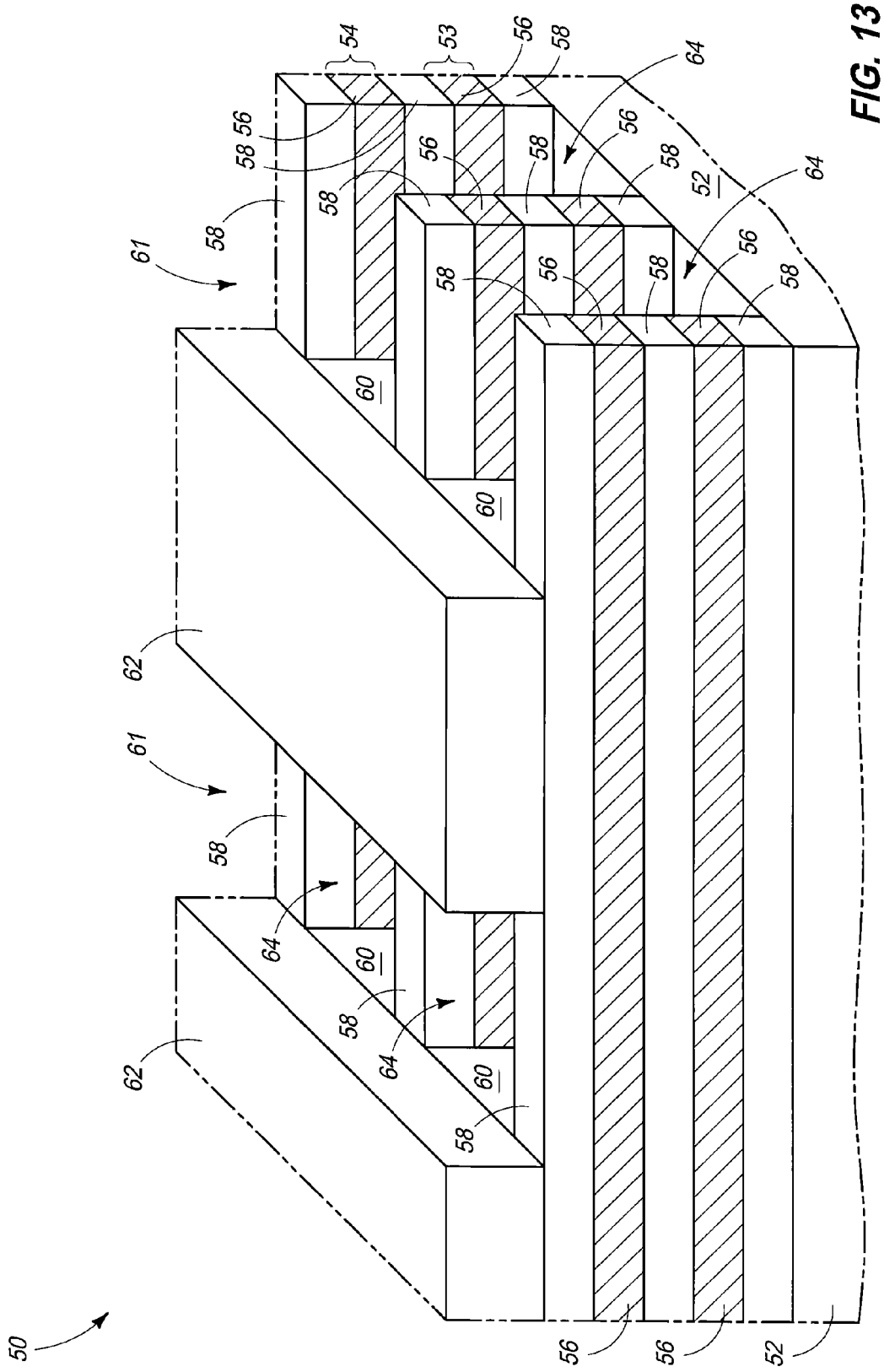
FIG. 13 is a view of the FIG. 12 substrate at a processing step subsequent to that shown by FIG. 12.

Referring to FIG. 13, a suitable hard-mask 62 has been formed as part of substrate 50. Such has been patterned to form mask openings 61 in the form of trench openings running generally orthogonal relative to the orientation of first electrode lines 56. Subsequently, as shown, hard-mask 62 has been used as an etch mask for anisotropically etching a plurality of vertically oriented openings 64 within dielectric material 60 between adjacent first electrode lines 56 within an individual tier, and to extend through multiple tiers 53, 54. In the depicted example, vertically oriented openings 64 have been formed to extend to base substrate 52.

Figure 14:
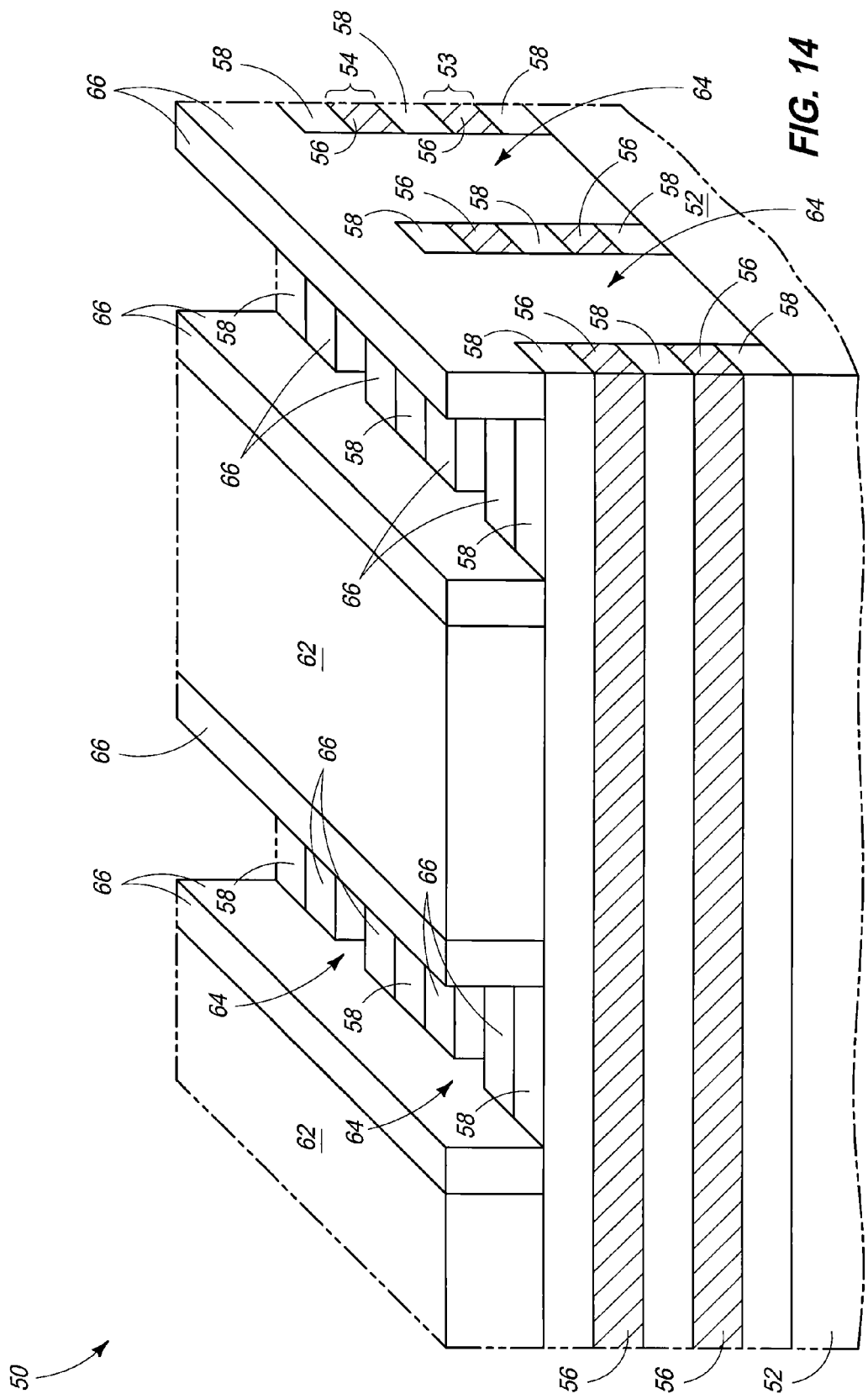
FIG. 14 is a view of the FIG. 13 substrate at a processing step subsequent to that shown by FIG. 13.

Referring to FIG. 14, openings 64 have been lined with sacrificial material 66 that extends through multiple tiers 53, 54. Sacrificial material 66 may be homogenous or non-homogenous, and comprise any of the attributes or materials described above with respect to sacrificial material 20. Sacrificial material 66 may be etched to be removed from overlying elevationally outermost surfaces, as shown.

Figure 15:
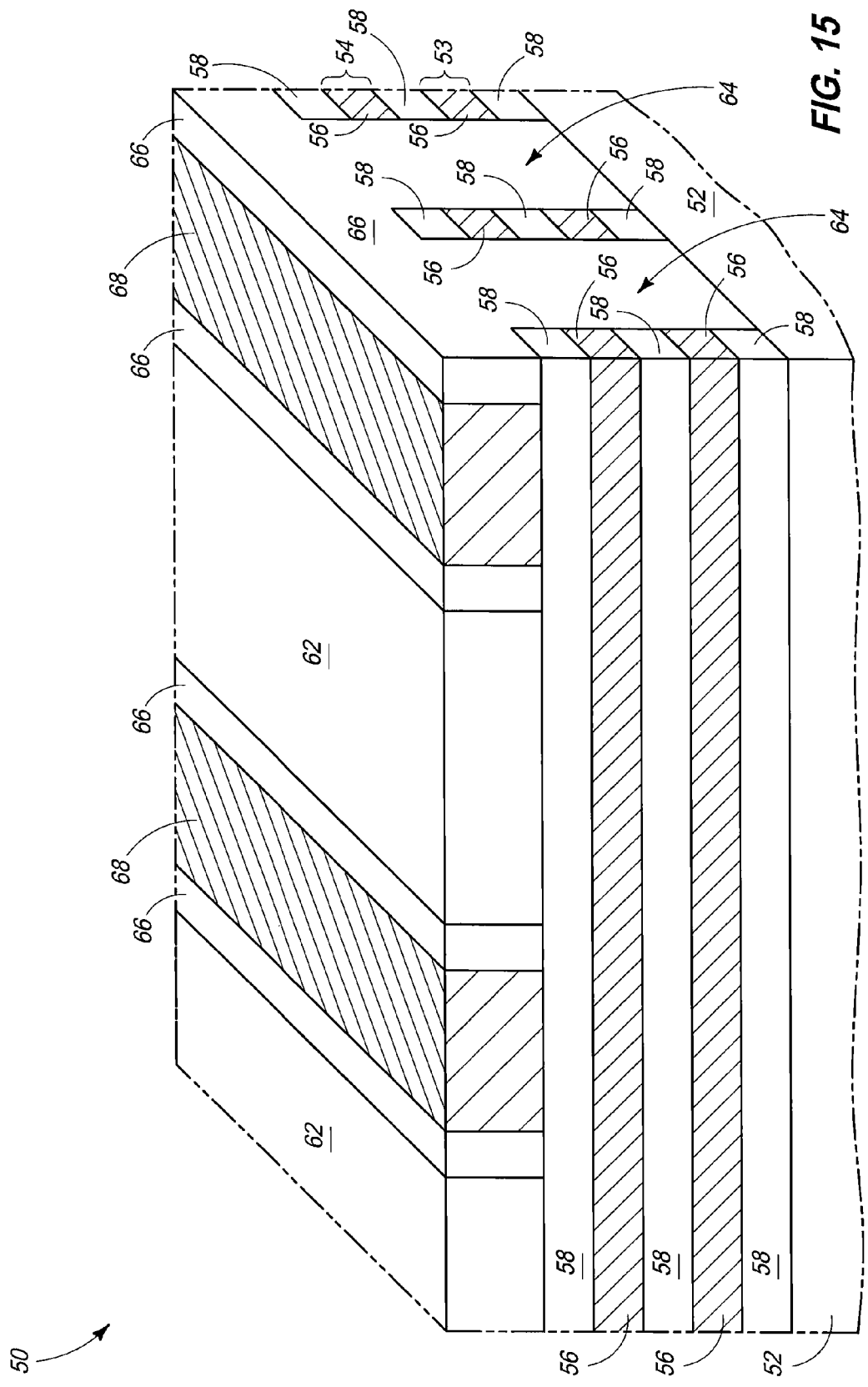
FIG. 15 is a view of the FIG. 14 substrate at a processing step subsequent to that shown by FIG. 14.

Referring to FIG. 15, current conductive material 68 has been formed within lined openings 64 and extends through multiple tiers 53, 54. Such may be homogenous or non-homogenous, and comprise any of the attributes or materials described above with respect to current conductive material 22.

Figure 16:
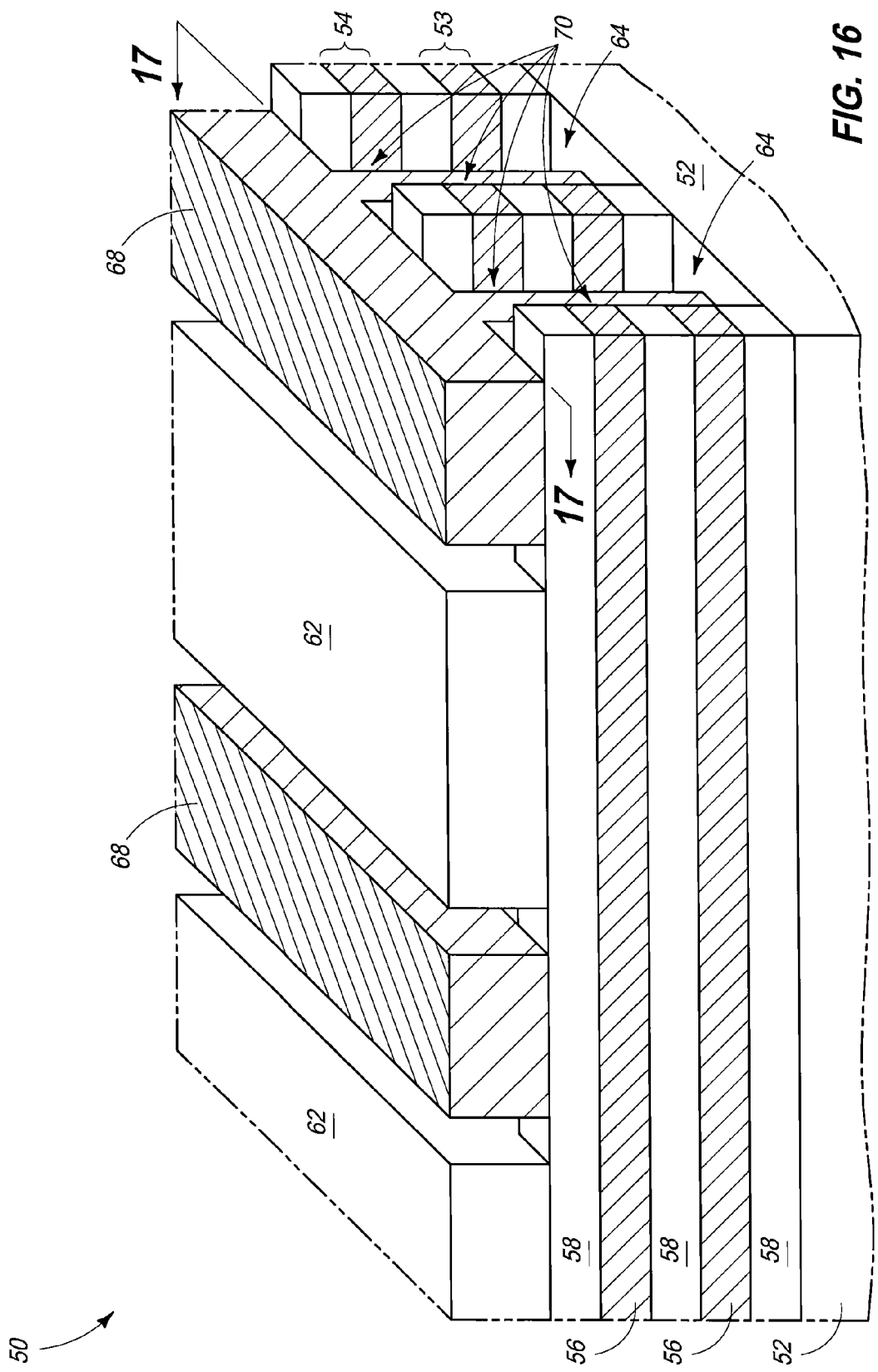
FIG. 16 is a view of the FIG. 15 substrate at a processing step subsequent to that shown by FIG. 15.
Figure 17:
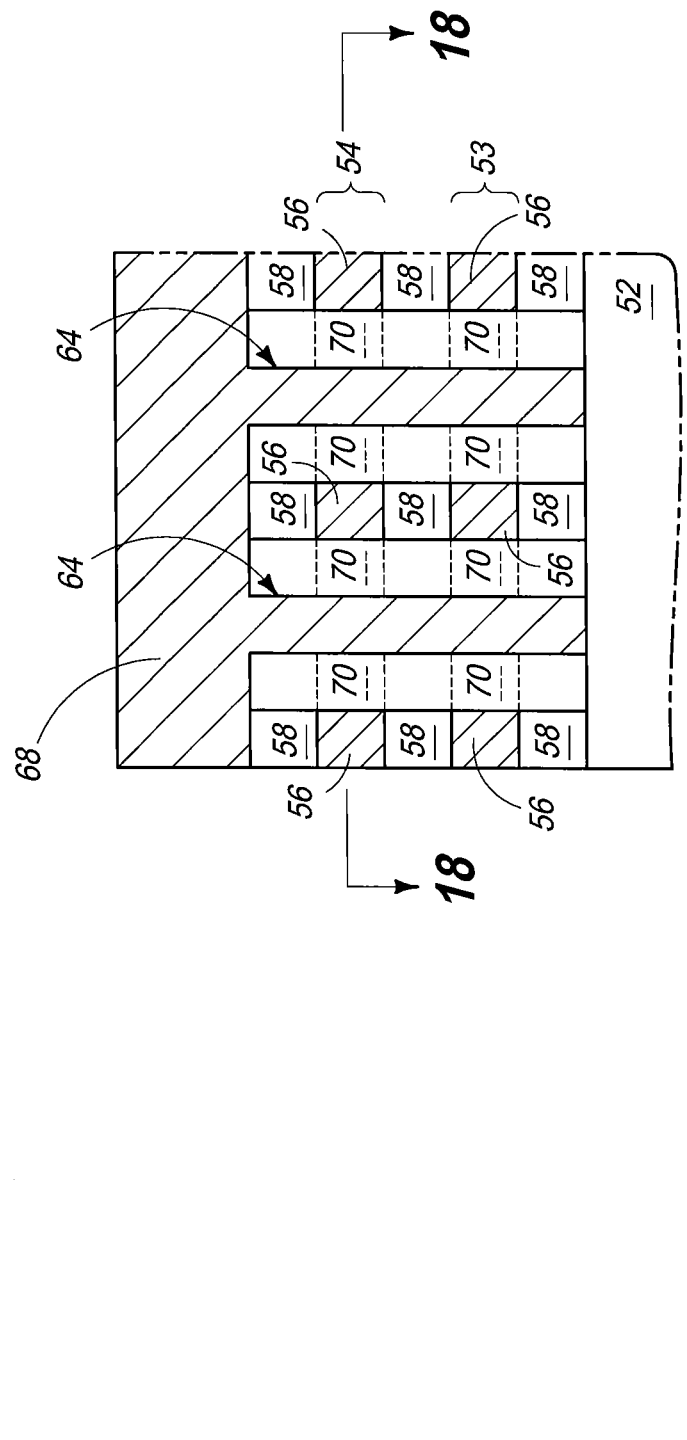
FIG. 17 is a sectional view of the FIG. 16 substrate taken through line 17-17 in FIG. 16.
Figure 18:
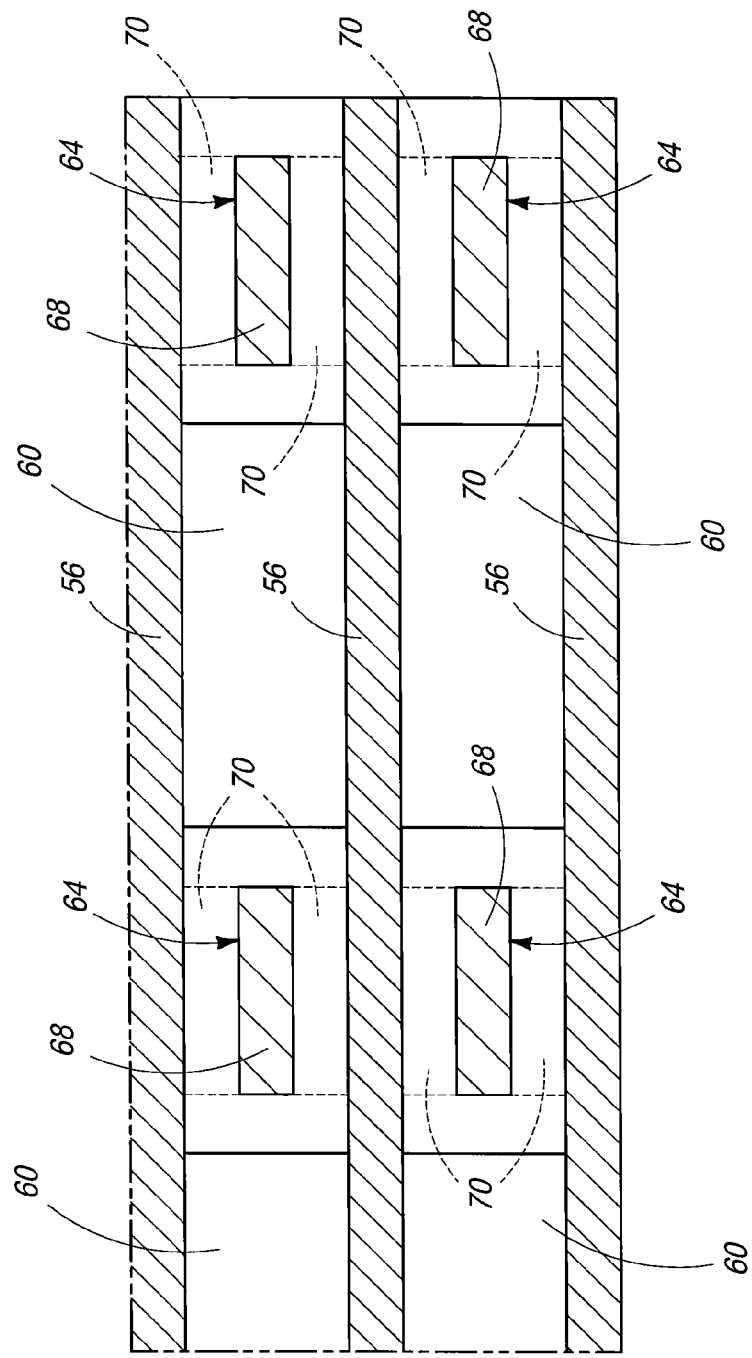
FIG. 18 is a sectional view of the FIG. 16 substrate taken through line 18-18 in FIG. 17.

Referring to FIGS. 16-18, sacrificial material 66 (not shown) has been removed from vertically oriented openings 64 to leave void space 70 laterally between the plurality of first electrode lines 56 and conductive material 68 within vertically oriented openings 64 where such conductive material and first electrode lines cross.

Figure 19:
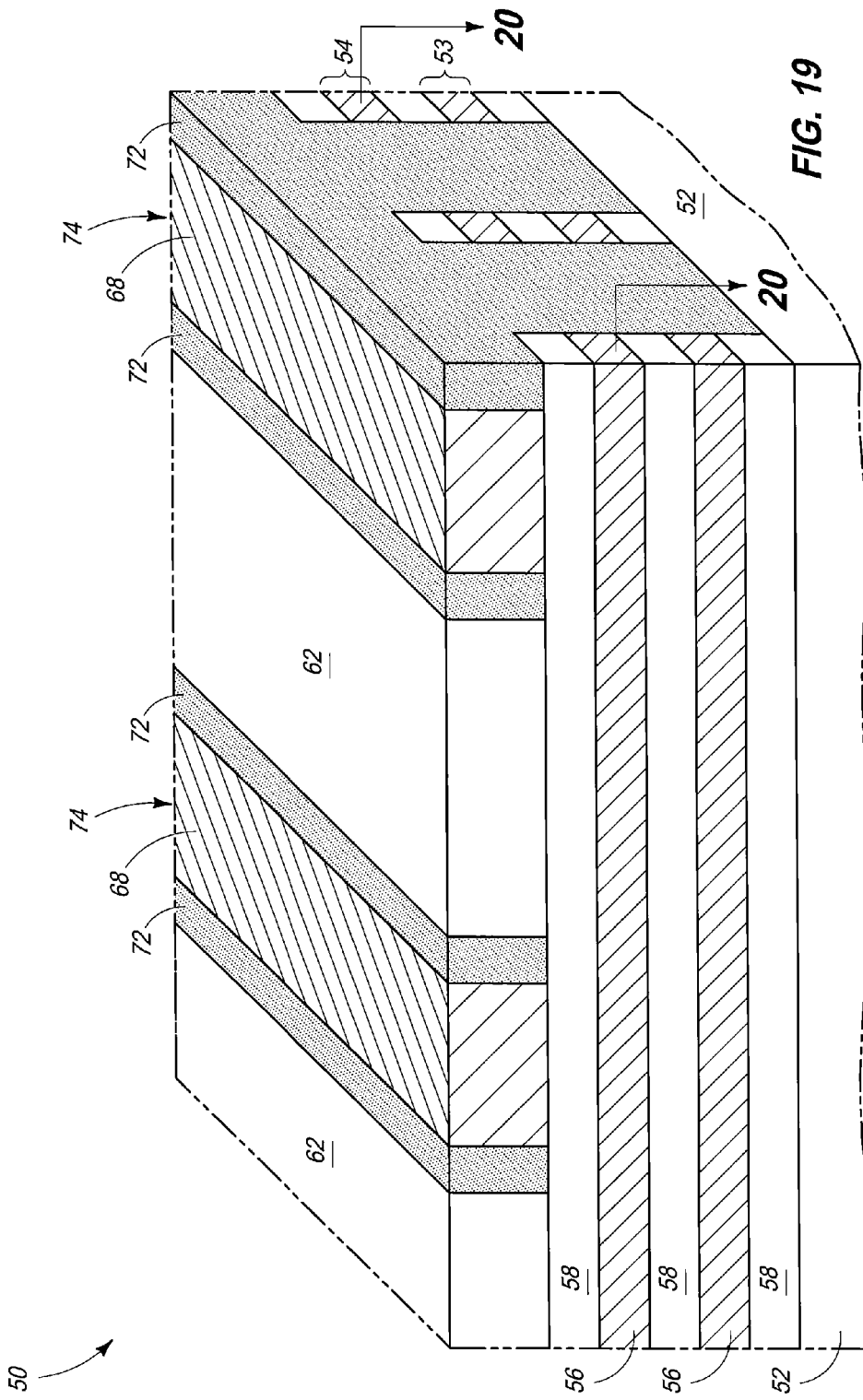
FIG. 19 is a view of the FIG. 16 substrate at a processing step subsequent to that shown by FIG. 16.
Figure 20:
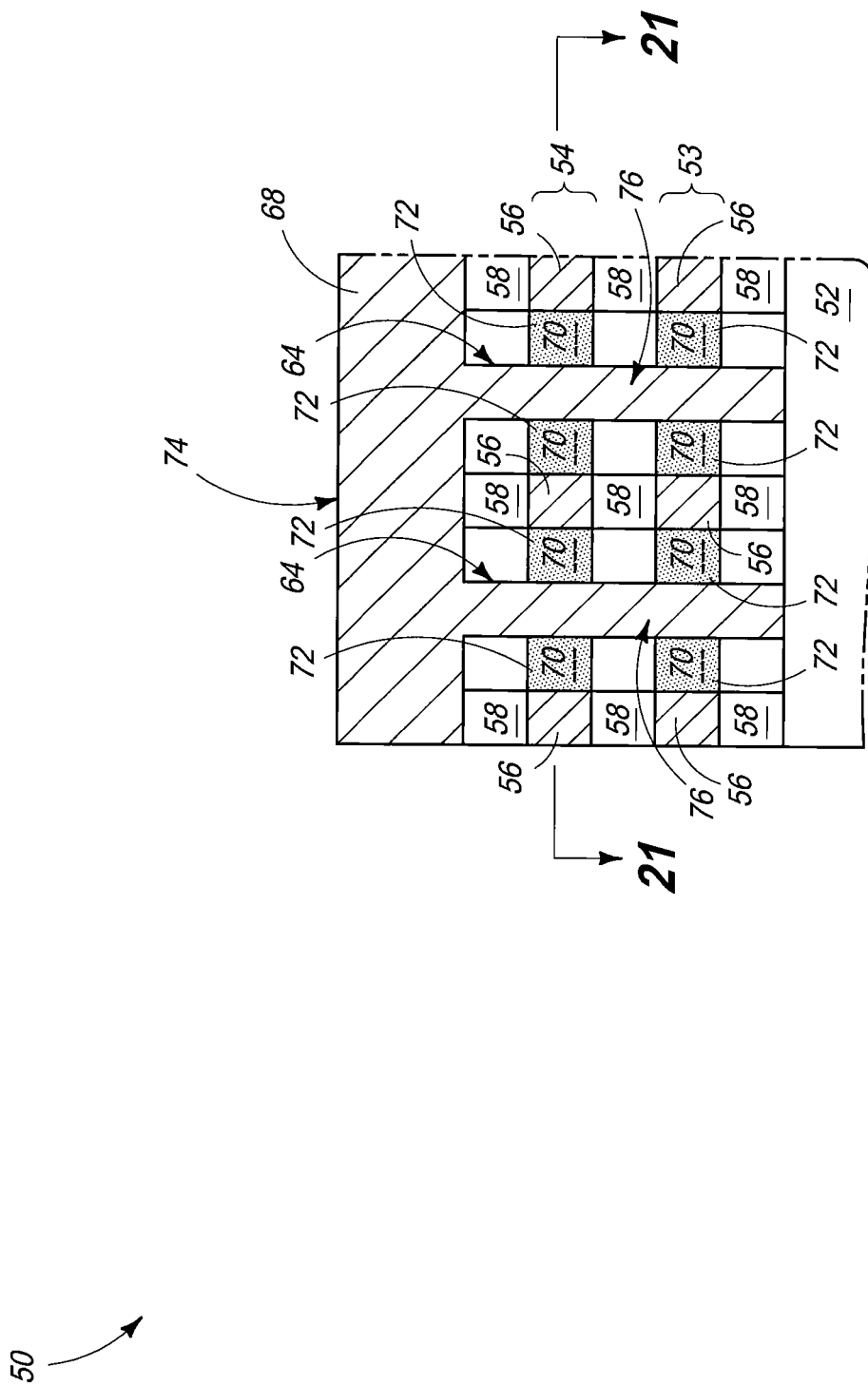
FIG. 20 is a sectional view of the FIG. 19 substrate taken through line 20-20 in FIG. 19.
Figure 21:
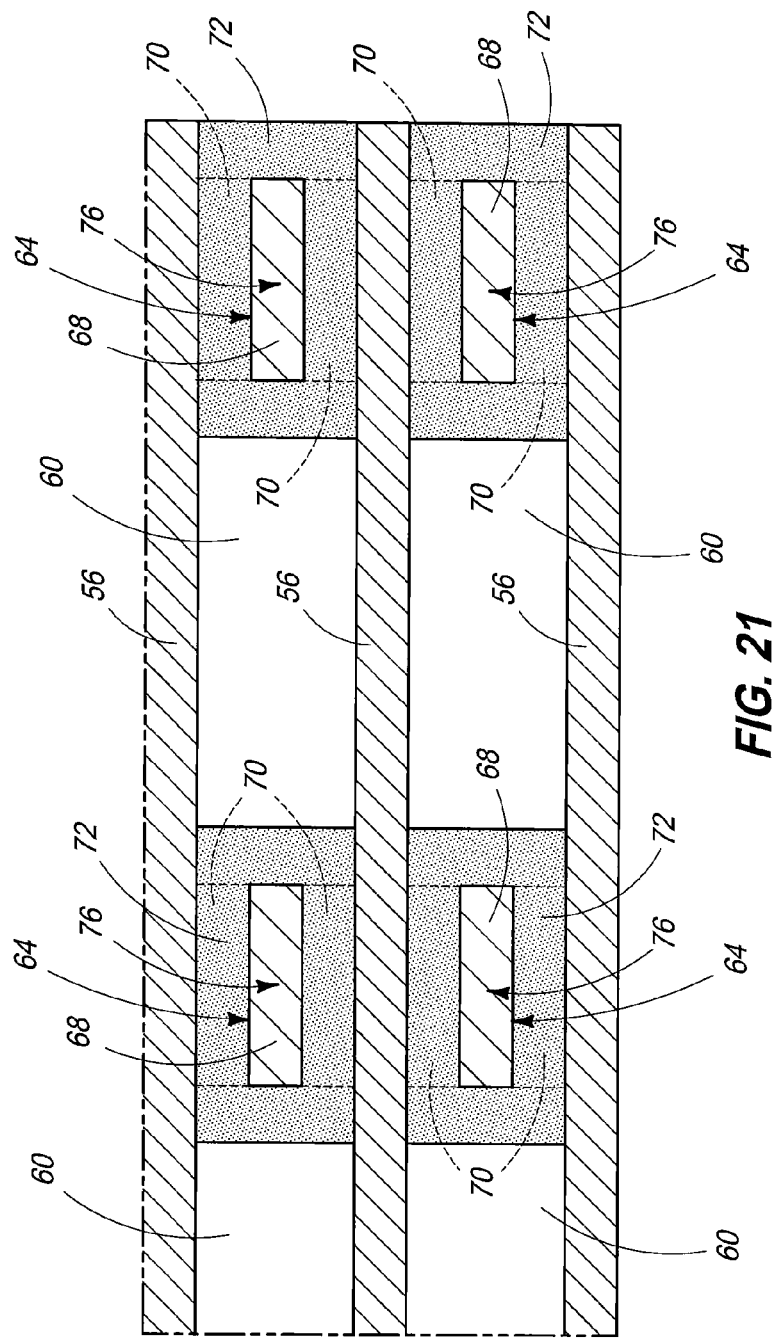
FIG. 21 is a sectional view of the FIG. 19 substrate taken through line 21-21 in FIG. 20.

Referring to FIGS. 19-21, programmable material 72 has been formed laterally between first electrode lines 56 and conductive material 68 where such cross. Accordingly and as only one example, FIGS. 19-21 depict an embodiment wherein all void space left from removal of the sacrificial material is filled with programmable material analogous to the embodiment of FIG. 5.

In one embodiment, a plurality of horizontally oriented global second electrode lines may be formed. Conductive material within individual of the vertically oriented openings may comprise a local vertically oriented second electrode line that extends from and in current conductive connection with individual of the horizontally oriented global second electrode lines. For example, FIGS. 19 and 20 depict example horizontally oriented global second electrode lines 74 which may extend across most or all of the array/sub-array. Conductive material 68 within individual vertically oriented openings 64 comprises respective local vertically oriented second electrode lines 76 that extend from and in current conductive connection with individual of horizontally oriented global second electrode lines 74. Such global and local lines may be of the same composition or of different compositions, and may be fabricated at the same or different times. Further, if fabricated at different times, the global lines and the local lines may be fabricated before or after the other. The processing of FIGS. 12-21 shows fabrication of global lines 74 essentially at the same time that conductive material 68 is formed within the lined openings. As alternate examples, the global second electrode lines may be formed beneath (not shown) tier 53. Further as an example, the horizontally oriented global second electrode lines may be formed separately and after formation of current conductive material within vertically oriented line openings.

One or more select devices may additionally be formed with respect to any of the embodiments described above with respect to FIGS. 12-21.

Embodiments of the invention encompass methods of forming a nonvolatile memory cell, with the above-described embodiments showing methods of forming a plurality of such cells. Regardless, such method of forming a memory cell comprises forming a first electrode, a second electrode, and providing sacrificial material between the first electrode and the second electrode. The sacrificial material is exchanged with programmable material to be used in the memory cell. In one embodiment, the sacrificial material may be exchanged with select device material in addition to exchanging the sacrificial material with programmable material. In one embodiment, the first electrode is formed before forming the second electrode, and the sacrificial material is provided by depositing such after forming the first electrode and prior to forming the second electrode. In one embodiment, the sacrificial material is deposited before depositing any second electrode material. Regardless, in one embodiment, no programmable material is provided between the first and second electrodes before exchanging the sacrificial material with programmable material.

In one embodiment, the first electrode and the second electrode are formed to be horizontally oriented. The embodiments of FIGS. 1-11 are example such embodiments. In one embodiment, one of the first and second electrodes is formed to be horizontally oriented and the other of the first and second electrodes is formed to be vertically oriented. The example embodiment of FIGS. 12-21 is such an example wherein the local conductive material extensions constitute such second electrodes. In one such embodiment, and as shown and described with respect to the embodiments of FIGS. 12-21, the first electrode is formed before the second electrode, and the first electrode is horizontally oriented.

In one embodiment, the second electrode is formed elevationally outward of the first electrode and the exchanging comprises removing the sacrificial material from between the first and second electrodes and subsequently depositing the programmable material elevationally under the second electrode and elevationally over the first electrode. The embodiments of FIGS. 1-11 are examples.

In one embodiment, the first and second electrodes are laterally oriented relative one another where such cross, with the sacrificial material being received laterally there-between. The exchanging of sacrificial material with programmable material comprises removing the sacrificial material from between the first and second electrodes and subsequently depositing the programmable material laterally between the first and second electrodes. The embodiments of FIGS. 12-21 are examples.

As described above, an array of individual memory cells may or may not comprise a select device within individual memory cells. Control and other circuitry may be received outside of or proximate edges of the array for reading, writing, and otherwise accessing the individual memory cells located where the individual electrode lines cross. However, additional circuit structures may be included within the individual memory cells.

Figure 22:
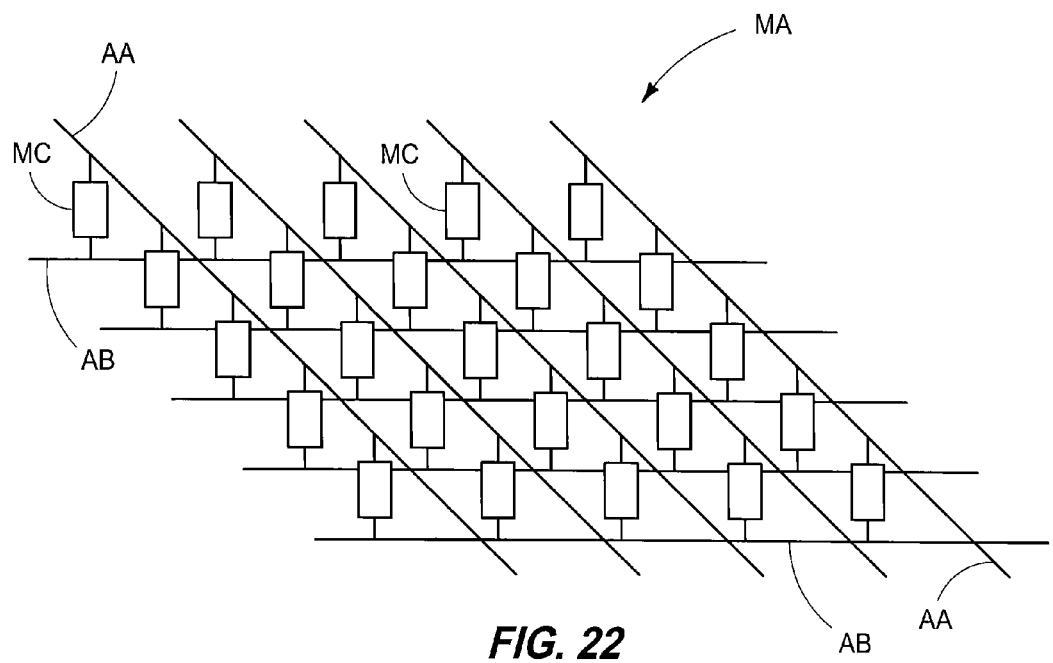
FIG. 22 is a diagrammatic and perspective schematic view of a memory array incorporating nonvolatile memory cells in accordance with an embodiment of the invention.

FIG. 22 is a schematic diagram of incorporation of a plurality of memory components MC within a memory array MA. Such includes a plurality or set of first access lines AA (i.e., word lines or bit lines) and a plurality or set of second access lines AB (i.e., the other of word lines or bit lines) forming a cross point-like array. The positions of the AA lines and AB lines may be reversed. Alternately, the function and operation of the AA and AB lines may be reversed or otherwise varied at different times by software control during operation of the memory array. Memory components MC may be received at each cross point of an access line AA and an access line AB, and may comprise programmable material. Select devices (not shown) may be at each intersection of a line AA and AB, and/or may be encompassed by diagrammatic memory components MC.

Figure 23:
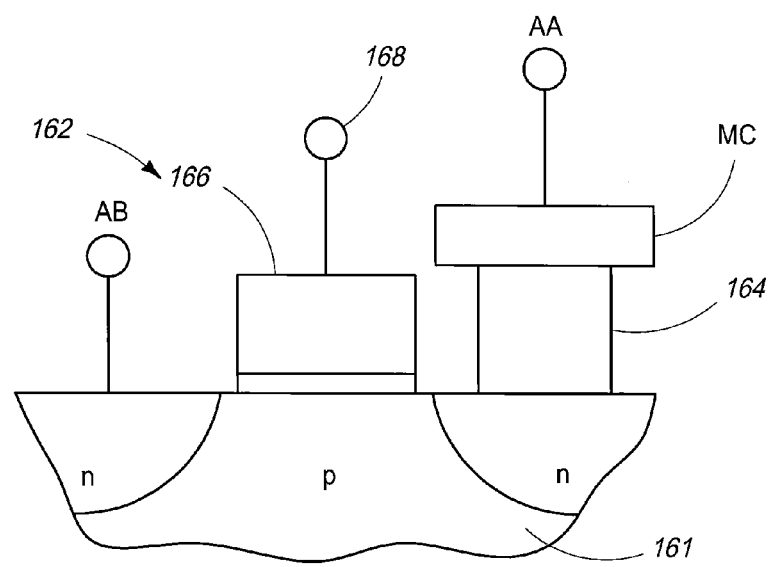
FIG. 23 is a diagrammatic hybrid schematic and sectional structural view of circuitry incorporating a nonvolatile memory cell in accordance with an embodiment of the invention.

FIG. 23 is an example schematic diagram of additional circuitry which might be fabricated to constitute a portion of cross points of memory array MA of FIG. 22 and the other above described embodiments. Such comprises an example transistor 162 electrically coupled with a nonvolatile memory component MC via a current conducting element 164. Semiconductor transistor 162 includes a region of a semiconductor substrate 161 having doped regions (e.g., illustrated as n-doped regions) and a channel region (e.g., illustrated as a p-doped region) between the n-doped regions. Transistor 162 includes a gate 166 which is current coupled to a metal contact or line 168 to allow selection and current to flow from a second access line AB to a first access line AA. The AA's and AB's may be reversed. Contacts/lines 168 are not shown in FIG. 22. Other embodiments, whether existing or yet-to-be-developed, are also of course contemplated.

Accordingly, in connection with the above described example embodiment of FIGS. 1-9, the AA's could be either electrode lines 28 or electrode lines 16 in either of FIGS. 22 and 23, with the AB's being the other of electrode lines 28 and 16. In the embodiment of FIGS. 12-21, the AA's could be either electrode lines 56 or electrode lines 74/76, with the AB's being the other of electrode lines 56 and 74/76. The memory components MC would comprise the programmable material and, if used, any above-described select device.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of nonvolatile memory cells, comprising:
    forming a plurality of horizontally oriented first electrode lines;
    forming sacrificial lines elevationally outward of and laterally coincident with the first electrode lines;
    forming a plurality of horizontally oriented second electrode lines elevationally outward of the sacrificial lines;
    removing the sacrificial lines to leave a void space elevationally between the first electrode lines and the second electrode lines where such cross; and
    after the removing, forming programmable material elevationally between the first and second electrode lines where such cross.

2. The method of claim 1 wherein individual memory cells comprise a select device; and further comprising:
    forming select device material elevationally between the first and second electrode lines where such cross before forming the programmable material.

3. The method of claim 1 wherein individual memory cells comprise a select device; and further comprising:
    forming select device material elevationally between the first and second electrode lines where such cross after forming the programmable material.

4. The method of claim 1 wherein the removing comprises wet etching.

5. The method of claim 1 wherein forming the programmable material comprises a selective deposition of the programmable material.

6. The method of claim 1 wherein forming the programmable material comprises a non-selective deposition of the programmable material.

7. The method of claim 1 wherein the removing comprises etching.

8. A method of forming an array of vertically stacked tiers of nonvolatile memory cells, comprising:
    forming multiple tiers that individually comprise a plurality of horizontally oriented first electrode lines;
    forming a plurality of vertically oriented openings within dielectric material between adjacent first electrode lines and that extends through the multiple tiers;
    lining the openings with sacrificial material that extends through multiple of the tiers;
    forming conductive material within the lined openings and that extends through multiple of the tiers;
    removing the sacrificial material from the vertically oriented openings to leave void space laterally between the plurality of horizontally oriented first electrode lines and the conductive material within the vertically oriented openings where the conductive material and the first electrode lines cross; and
    after the removing, forming programmable material laterally between the first electrode lines and the conductive material where such cross.

9. The method of claim 8 comprising forming a plurality of horizontally oriented global second electrode lines, the conductive material within individual of the vertically oriented openings comprising a local vertically oriented second electrode line that extends from and in current conductive connection with an individual of said horizontally oriented global second electrode lines.

10. The method of claim 9 wherein the horizontally oriented global second electrode lines are formed after forming the conductive material in the lined openings.

11. The method of claim 9 wherein the horizontally oriented global second electrode lines are formed before forming the conductive material in the lined openings.

12. The method of claim 8 wherein the removing comprises etching.

* * * * *

UNITED STATES PATENT AND TRADEMARK OFFICE
CERTIFICATE OF CORRECTION

PATENT NO. : 8,652,909 B2  
APPLICATION NO. : 13/532483  
DATED : February 18, 2014  
INVENTOR(S) : Scott E. Sills et al.

It is certified that error appears in the above-identified patent and that said Letters Patent is hereby corrected as shown below:

On the Title page, Item (54), and in the Specification, in column 1, lines 4-5, in the title, after "CELLS" delete "ARRAY OF NONVOLATILE MEMORY CELLS".

On the Title page, Item (57), in column 2, line 3, after "first" insert -- and --.

Signed and Sealed this
Twenty-ninth Day of April, 2014

Michelle K. Lee
*Deputy Director of the United States Patent and Trademark Office*